US012767776B2

(12) United States Patent
Tokuda et al.

(10) Patent No.: US 12,767,776 B2
(45) Date of Patent: Oct. 20, 2026

(54) LAYERED BODY AND DISPLAY DEVICE

(71) Applicant: SUMITOMO CHEMICAL COMPANY, LIMITED, Tokyo (JP)

(72) Inventors: Masayoshi Tokuda, Osaka (JP); Yoshihiro Harada, Osaka (JP); Yoshifumi Komatsu, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 492 days.

(21) Appl. No.: 18/022,740

(22) PCT Filed: Aug. 12, 2021

(86) PCT No.: PCT/JP2021/029729
§ 371 (c)(1),
(2) Date: Feb. 22, 2023

(87) PCT Pub. No.: WO2022/044824
PCT Pub. Date: Mar. 3, 2022

(65) Prior Publication Data

US 2023/0213690 A1 Jul. 6, 2023

(30) Foreign Application Priority Data

Aug. 31, 2020 (JP) ................................ 2020-145875

(51) Int. Cl.
*C09D 5/22* (2006.01)
*C08J 7/04* (2020.01)
(Continued)

(52) U.S. Cl.
CPC .............. *C08J 7/0427* (2020.01); *C09D 5/22* (2013.01); *C09D 7/61* (2018.01); *C09K 11/671* (2013.01);
(Continued)

(58) Field of Classification Search
CPC .................. C08J 7/0427; C08J 2323/08; C08J 2433/12; C08J 7/04; C09D 5/22; C09D 7/61;
(Continued)

(56) References Cited

U.S. PATENT DOCUMENTS 3,549,367 A 12/1970 Chang et al.
11,592,701 B2 * 2/2023 Garbar .............. G02F 1/133624
(Continued)

FOREIGN PATENT DOCUMENTS

JP S48-38403 B1 11/1973
JP S62-174204 A 7/1987
(Continued)

OTHER PUBLICATIONS

International Searching Authority, "International Search Report," issued in connection with International Patent Application No. PCT/JP2021/029729, dated Oct. 12, 2021.
(Continued)

*Primary Examiner* — Bumsuk Won
*Assistant Examiner* — John Curtis Sipes
(74) *Attorney, Agent, or Firm* — Foley & Lardner LLP

(57) ABSTRACT

There are provided a layered body and a display device including the same, the layered body including a substrate layer and a resin layer disposed on at least one surface of the substrate layer, in which the resin layer contains a light scattering agent (A), and, when the surface tension of the substrate layer is indicated by σs (mN/m), and the surface tension of the resin layer is indicated by σr (mN/m), the following formula: $|\sigma s-\sigma r|\leq 11.0$ is satisfied.

6 Claims, 1 Drawing Sheet

(51) Int. Cl.
*C09D 7/61* (2018.01)
*C09K 11/67* (2006.01)
*G02B 5/02* (2006.01)
*H10K 50/115* (2023.01)

(52) U.S. Cl.
CPC ......... *G02B 5/0226* (2013.01); *G02B 5/0294* (2013.01); *H10K 50/115* (2023.02)

(58) Field of Classification Search
CPC ................ C09K 11/671; G02B 5/0226; G02B 5/0294; G02B 5/02; G02B 5/20; H10K 50/115; H10K 59/38; G03F 7/0388; G03F 7/0007; G03F 7/0047; G03F 7/027; G03F 7/004; G03F 7/0042; G03F 7/028; C03C 2217/445; C03C 2217/477; C03C 2217/48; C03C 2217/732; C03C 17/007; C03C 17/009; C03C 17/32; C08F 220/14; C08F 2/48; C08F 2/44; C08F 2/50; C08K 3/013; C08K 2003/2241; C08K 3/22; H05B 33/14
See application file for complete search history.

(56) References Cited

U.S. PATENT DOCUMENTS

| | | | | |
|---|---|---|---|---|
| 2008/0156421 | A1 | 7/2008 | Lee et al. | |
| 2009/0145549 | A1* | 6/2009 | Komatsu | G11B 7/266 156/280 |
| 2014/0001405 | A1 | 1/2014 | Guo et al. | |
| 2014/0363767 | A1* | 12/2014 | Murakami | G03F 7/0007 430/311 |
| 2019/0278177 | A1 | 9/2019 | Jeong et al. | |
| 2020/0231871 | A1* | 7/2020 | Kim | C08F 2/40 |
| 2020/0377672 | A1* | 12/2020 | Tashiro | C08H 6/00 |
| 2021/0043873 | A1* | 2/2021 | Sung | H10K 59/8731 |
| 2021/0189230 | A1* | 6/2021 | Iida | B32B 27/36 |

FOREIGN PATENT DOCUMENTS

| | | | |
|---|---|---|---|
| JP | H06-75372 | A | 3/1994 |
| JP | H06-75373 | A | 3/1994 |
| JP | H07-10913 | A | 1/1995 |
| JP | 2000-080068 | A | 3/2000 |
| JP | 2003-098346 | A | 4/2003 |
| JP | 2003-195046 | A | 7/2003 |
| JP | 2004-126549 | A | 4/2004 |
| JP | 2006-227353 | A | 8/2006 |
| JP | 2006-309219 | A | 11/2006 |
| JP | 2006-310303 | A | 11/2006 |
| JP | 2009-251129 | A | 10/2009 |
| JP | 2009-251190 | A | 10/2009 |
| JP | 2011-132215 | A | 7/2011 |
| JP | 2011-137879 | A | 7/2011 |
| JP | 2011-178776 | A | 9/2011 |
| JP | 2013-015812 | A | 1/2013 |
| JP | 2014-002363 | A | 1/2014 |
| JP | 2015-529698 | A | 10/2015 |
| JP | 2016-022661 | A | 2/2016 |
| JP | 2016-065178 | A | 4/2016 |
| JP | 2016-161834 | A | 9/2016 |
| JP | 2016-526174 | A | 9/2016 |
| JP | 2018-123274 | A | 8/2018 |
| JP | 2018-131612 | A | 8/2018 |
| JP | 2019-113759 | A | 7/2019 |
| JP | 2020-003775 | A | 1/2020 |
| JP | 2020-076976 | A | 5/2020 |
| KR | 10-2018-0056860 | A | 5/2018 |
| KR | 10-2018-0067243 | A | 6/2018 |
| WO | WO-2008/078678 | A1 | 7/2008 |
| WO | WO-2008/078686 | A1 | 7/2008 |
| WO | WO-2012/132558 | A1 | 10/2012 |

OTHER PUBLICATIONS

International Searching Authority, "Written Opinion," issued in connection with International Patent Application No. PCT/JP2021/029729, dated Oct. 12, 2021.

* cited by examiner

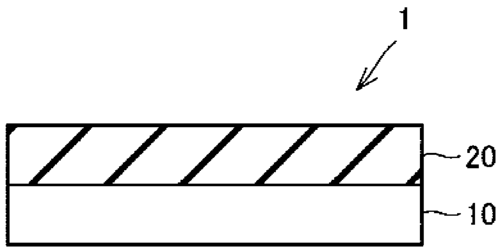
1
20
10

LAYERED BODY AND DISPLAY DEVICE

CROSS-REFERENCE TO RELATED APPLICATIONS

The present application claims priority under 35 U.S.C. § 371 to International Patent Application No. PCT/JP2021/029729, filed Aug. 12, 2021, which claims priority to and the benefit of Japanese Patent Application No 2020-145875, filed on Aug. 31, 2020. The contents of these applications are hereby incorporated by reference in their entireties.

TECHNICAL FIELD

The present invention relates to a layered body including a resin layer and a display device including the layered body.

BACKGROUND ART

Patent Literature 1 discloses that a wavelength conversion film is formed on a substrate by a step of forming a coated film of a curable resin composition containing quantum dots on the substrate, a step of irradiating the coated film with radiation, a step of developing the coated film irradiated with radiation and a step of exposing the developed coated film and a light-emitting display element or the like is constituted using this wavelength conversion film.

CITATION LIST

Patent Literature

Patent Literature 1: Japanese Patent Laid-Open No.

SUMMARY OF INVENTION

Technical Problem

There are cases where a light scattering agent is contained in a resist composition such as the curable resin composition disclosed in Patent Literature 1, thereby imparting a light scattering property to a resin layer formed from the resist composition, but it has been clarified by the present inventors' studies that, particularly when a resin layer contains a light scattering agent, a defect portion tends to be generated in the resin layer. The defect portion refers to a region where the resin layer is not present on a substrate layer and the surface of the substrate layer is exposed or a region where the thickness is relatively extremely reduced in the resin layer.

An object of the present invention is to provide a layered body including a resin layer containing a light scattering agent on a substrate layer, in which the generation of a defect portion in the resin layer is suppressed, and a display device including the layered body.

Solution to Problem

The present invention provides a layered body and a display device shown below.

[1] A layered body comprising: a substrate layer; and a resin layer disposed on at least one surface of the substrate layer, wherein the resin layer contains a light scattering agent (A), and when a surface tension of the substrate layer is indicated by σs (mN/m) and a surface tension of the resin layer is indicated by σr (mN/m), the following formula:

$$|\sigma s-\sigma r|\leq 11.0$$

is satisfied.

[2] The layered body according to [1], wherein the following formula:

$$0.1\leq|\sigma s-\sigma r|$$

is further satisfied.

[3] The layered body according to [1] or [2], wherein the surface tension σs is 30 mN/m or more.

[4] The layered body according to any one of [1] to [3], wherein the resin layer further contains quantum dots (B).

[5] The layered body according to any one of [1] to [4], wherein the resin layer is a cured material layer of a resin composition containing a resin (C), a photopolymerizable compound (D), and a photopolymerization initiator (E).

[6] The layered body according to any one of [1] to [5], wherein the light scattering agent (A) contains $TiO_2$ particles.

[7] A display device comprising the layered body according to any one of [1] to [6].

Advantageous Effects of Invention

It is possible to provide a layered body including a resin layer containing a light scattering agent on a substrate layer, in which the generation of a defect portion in the resin layer is suppressed, and a display device including the layered body.

BRIEF DESCRIPTION OF DRAWING

The FIGURE is a schematic cross-sectional view showing an example of the layer configuration of a layered body according to the present invention.

DESCRIPTION OF EMBODIMENTS

<Layered Body>

[1] Constitution and Surface Tension Difference Δσ of Layered Body

A layered body according to the present invention (hereinafter, also simply referred to as "layered body") includes a substrate layer and a resin layer that is disposed on at least one surface of the substrate layer and contains a light scattering agent (A). Usually, there is no layer interposing between the substrate layer and the resin layer in the layered body, and the resin layer is, usually, directly layered on the substrate layer.

The FIGURE is a schematic cross-sectional view showing an example of the layer configuration of the layered body. A layered body 1 shown in the FIGURE includes a substrate layer 10 and a resin layer 20 disposed on one surface of the substrate layer 10. The resin layer 20 is directly layered on the substrate layer 10. The resin layer 20 contains a light scattering agent (A). The light scattering agent (A) is usually dispersed in the resin layer 20. The resin layers 20 may be disposed on both surfaces of the substrate layer 10.

The resin layer 20 may further contain quantum dots (B). In this case, the resin layer 20 can emit light having a wavelength different from that of irradiation light by being irradiated with ultraviolet light or visible light. Therefore, the resin layer 20 containing the quantum dots (B) can be used as a wavelength conversion film. The wavelength of light to be emitted can be selected by selecting the component or particle size of the quantum dots (B).

In the case where the resin layer 20 contains the quantum dots (B), the quantum dots (B) are usually dispersed in the resin layer 20.

The resin layer 20 may not contain quantum dots (B). In this case, the resin layer 20 has a function of causing light having the same wavelength as that of the irradiation light to scatter and outgo without converting the wavelength of the irradiation light. In addition, in this case, since a defect portion is hardly generated in the resin layer 20 of the layered body according to the present invention, the intensity of scattered light on the light-outgoing surface hardly varies.

As shown in the FIGURE, the resin layer 20 may be formed on the entire surface of the substrate layer 10 or may be formed on a part of the surface of the substrate layer. The case where the resin layer 20 is formed on a part of the surface of the substrate layer is, for example, a case where the resin layer 20 is formed in a pattern.

The case where the resin layer is formed on a part of the surface of the substrate layer mentioned herein does not refer to a defect portion that is generated against the will, but is a case where the resin layer is formed on a part of the surface of the substrate layer on purpose in terms of design.

In the layered body according to the present invention, when the surface tension of the substrate layer is indicated by σs (mN/m), and the surface tension of the resin layer is indicated by σr (mN/m), the following formula:

$$|\sigma s - \sigma r| \leq 11.0$$

is satisfied.

When the formula is satisfied, the surface of the substrate layer and the surface of the resin layer tend to become common, and thus it is possible to obtain a layered body in which the number of defect portions in the resin layer is small.

Hereinafter, the left side |σs−σr| of the formula will also be represented by "Δσ" (surface tension difference).

From the viewpoint of suppressing a defect portion, Δσ is preferably 10.8 mN/m or less (for example, 10.5 mN/m or less, 10.0 mN/m or less, 9.5 mN/m or less or 9.0 mN/m or less).

On the other hand, Δσ is usually 0.1 mN/m or more, and from the viewpoint of the developability of the resin layer, Δσ is preferably 0.2 mN/m or more, more preferably 0.5 mN/m or more, and still more preferably 1.0 mN/m or more.

σs is usually 10 mN/m or more and 60 mN/m or less, and from the viewpoint of suppressing a defect portion, preferably 15 mN/m or more and 55 mN/m or less, more preferably 20 mN/m or more and 50 mN/m or less, and still more preferably 30 mN/m or more and 50 mN/m or less.

σr is usually 15 mN/m or more and 50 mN/m or less, and from the viewpoint of suppressing a defect portion, preferably 20 mN/m or more and 45 mN/m or less, more preferably 25 mN/m or more and 40 mN/m or less, and still more preferably 30 mN/m or more and 40 mN/m or less.

In the present specification, the surface tension σs of the substrate layer refers to the surface tension of the surface of the substrate layer on which the resin layer is disposed. When the resin layer is disposed on the substrate layer, the surface tension σs may be obtained by peeling the resin layer by an asking treatment with plasma or the like or a treatment with a chemical so that the surface characteristics do not change and measuring the peeled surface. In addition, the surface tension of the outside surface (the surface opposite to the substrate layer side) of the resin layer that is disposed on the substrate layer is also regarded as the surface tension σr of the resin layer.

The surface tensions of the surface of the substrate layer on which the resin layer is disposed and the surface opposite thereto are usually the same as each other when a pretreatment described later is not performed on these surfaces or the same pretreatment has been performed on these surfaces. The surface tensions of the outside surface (the surface opposite to the substrate layer side) of the resin layer and the surface opposite thereto are usually the same as each other.

The surface tension σs and the surface tension σr are values at 25° C. The surface tension σs and the surface tension σr are measured according to the measurement method described in the section of Examples below.

In the layered body according to the present invention, from the viewpoint of suppressing a defect portion, when the contact angle of the substrate layer with respect to diiodomethane is indicated by θs (°), and the contact angle of the resin layer with respect to diiodomethane is indicated by θr (°), the following formula:

$$|\theta s - \theta r| \leq 21$$

is preferably satisfied. Hereinafter, the left side |θs−θr| of the formula will also be represented by "Δθ" (contact angle difference).

From the viewpoint of suppressing a defect portion, Δθ is more preferably 20° or less and still more preferably 19.3° or less (for example, 15° or less, 10° or less, or 5° or less).

On the other hand, Δθ is usually 0.1° or more, and from the viewpoint of the developability of the resin layer, Δθ is preferably 0.2° or more, more preferably 0.3° or more, and still more preferably 0.4° or more.

θs is usually 15° or more and 75° or less, and from the viewpoint of suppressing a defect portion, preferably 20° or more and 70° or less, more preferably 25° or more and 60° or less, still more preferably 30° or more and 60° or less, yet still more preferably 30° or more and 50° or less, and particularly preferably 30° or more and 45° or less.

θr is usually 20° or more and 70° or less, and from the viewpoint of suppressing a defect portion, preferably 30° or more and 60° or less, more preferably 40° or more and 58° or less, and may be 50° or less.

In the present specification, the contact angle θs of the substrate layer with respect to diiodomethane refers to the contact angle of the surface of the substrate layer on which the resin layer is disposed with respect to diiodomethane. When the resin layer is disposed on the substrate layer, the contact angle θs may be obtained by peeling the resin layer by an asking treatment with plasma or the like or a treatment with a chemical so that the surface characteristics do not change and measuring the peeled surface. In addition, the contact angle of the outside surface (the surface opposite to the substrate layer side) of the resin layer that is disposed on the substrate layer is also regarded as the contact angle θr of the resin layer with respect to diiodomethane.

The contact angles with respect to diiodomethane of the surface of the substrate layer on which the resin layer is disposed and the surface opposite thereto are usually the same as each other when the pretreatment described later is not performed on these surfaces or the same pretreatment has been performed on these surfaces. The contact angles with respect to diiodomethane of the outside surface (the surface opposite to the substrate layer side) of the resin layer and the surface opposite thereto are usually the same as each other.

The contact angle θs and the contact angle θr are values at 25° C. The contact angle θs is measured using a contact angle measuring device by a θ/2 method after 1.0 μL of a droplet of diiodomethane is added dropwise onto the surface of the substrate layer on which the resin layer is disposed under an environment of 25° C. The contact angle θr is measured using a contact angle measuring device by the θ/2 method after 1.0 μL of a droplet of diiodomethane is added dropwise onto the outside surface (the surface opposite to the substrate layer side) of the resin layer in the layered body under an environment of 25° C.

The defect portion in the resin layer can be evaluated by, for example, the following method. The layered body is placed on a black plate so that the substrate layer comes into contact with the black plate. The layered body is irradiated with light from a fluorescent lamp above the layered body, and an image of the resin layer side of the layered body is acquired. At this time, a defect portion of the resin layer appears black since the resin layer is not present on the substrate layer or the thickness of the resin layer is relatively extremely reduced. On the other hand, a good region with no defect portions is clearly different from black and exhibits a white, green, red, or different color depending on the kind of the light scattering agent or the quantum dots present in the resin layer. The defect portion can be evaluated by calculating the area ratio of a region exhibiting a color other than black (white, green, red, or other color) using image processing software when the total of a region exhibiting a black color and the region exhibiting a color other than black is regarded as 100%. It can be said that the number of the defect portions decreases as the area ratio increases.

The fact that "the thickness of the resin layer is relatively extremely reduced" refers to a fact that the film thickness of the resin layer is extremely reduced to be smaller than the average film thickness of the entire resin layer, and the film thickness is, for example, 10% or less of the average film thickness.

In the layered body according to the present invention, the area ratio is preferably 50% or more, more preferably 60% or more, still more preferably 70% or more, yet still more preferably 80% or more, particularly preferably 90% or more, most preferably 95% or more and may be 100%.

[2] Resin Composition

The resin layer in the layered body can be formed from a resin composition. The resin layer can be formed by, for example, a method including a step of applying the resin composition to the substrate layer and a drying step that is performed as necessary.

The resin composition contains the light scattering agent (A) and a resin (C). The resin composition is preferably a curable resin composition further containing a photopolymerizable compound (D) and a photopolymerization initiator (E) in addition to the light scattering agent (A) and the resin (C).

The resin layer is preferably a cured material layer formed from the curable resin composition. The resin layer, which is a cured material layer, can be formed by a method including a step of applying the curable resin composition to the substrate layer, a drying step that is performed as necessary, and a step of curing the curable resin composition by the action of light and, if necessary, further by the action of heat.

The cured material layer may be formed on the entire surface of the substrate layer or may be formed on a part of the substrate layer as a cured pattern. As used herein, the cured pattern is one embodiment of the cured material layer and refers to a cured material layer formed in a pattern.

[2-1] Light Scattering Agent (A)

The resin composition contains one or more light scattering agents (A). In the resin layer formed from the resin composition, the light scattering agent (A) is dispersed, and the resin layer can exhibit a light scattering property. When the light scattering agent (A) is contained in the resin layer, it is possible to control the light transmittance or viewing angle characteristics of the resin layer (wavelength conversion film or the like) or to improve the outgoing light intensity of light when the resin layer is used as a bank or the resin layer contains the quantum dots (B).

"Outgoing light intensity" mentioned in the present specification refers to the intensity of light outgoing from the resin layer and may be measured as brightness. For example, "outgoing light intensity" may include both the intensity of light when an incident light that has been incident on the resin layer from a light source outgoes from the side where the incident light has been incident toward a side of an opposite main surface of the resin layer opposite to the light source (for example, an incident light that has been incident on the resin layer from a light source of a backlight unit outgoes toward a display side) and the intensity of extracted light when fluorescence emitted by the quantum dots (B) in the resin layer (internal light emission) is extracted toward one side of the opposite main surface of the resin layer from the resin layer by excitation light incident on the resin layer from a light source (for example, a display side in the case where a display is disposed above the resin layer in a backlight unit).

Examples of the light scattering agent (A) include particles of metal or metal oxide and inorganic particles such as glass particles, and particles of metal oxide are preferable since the particles of metal oxide do not absorb light by coloration and have only a scattering effect. Examples of the metal oxide include $TiO_2$, $SiO_2$, $BaTiO_3$, ZnO and the like, and $TiO_2$ particles are preferable since $TiO_2$ particles efficiently scatter light. Generally, the inorganic particles hardly disperse in solvents as they are, and thus, usually, a dispersant described later is used. However, since the specific weight is large, the inorganic particles tend to settle in the resin composition and are likely to nonuniformly disperse in the resin layer, and thus a defect portion tends to be generated in the resin layer on the substrate layer. In addition, the surface tension of the resin layer can also be changed by the dispersion state of the light scattering agent (A) in the resin layer.

The particle size of the light scattering agent (A) is, for example, 0.03 μm or more and 20 μm or less, and from the viewpoint of increasing the light scattering capability and increasing the dispersibility in the resin composition, preferably 0.05 μm or more and 1 μm or less, and more preferably 0.05 μm or more and 0.5 μm or less.

As the light scattering agent (A), a light scattering agent previously dispersed in a part or the whole of the solvent (F) described later using a dispersant may be used. Commercially available products may also be used as the dispersant.

Examples of the commercially available products include: DISPERBYK-101, 102, 103, 106, 107, 108, 109, 110, 111, 116, 118, 130, 140, 154, 161, 162, 163, 164, 165, 166, 170, 171, 174, 180, 181, 182, 183, 184, 185, 190, 192, 2000, 2001, 2020, 2025, 2050, 2070, 2095, 2150, 2155; ANTI-TERRA-U, U100, 203, 204, 250, BYK-P104, P104S, P105, 220S, 6919; BYK-LPN6919, and 21116; LACTIMON and LACTIMON-WS; Bykumen; and the like, manufactured by BYK Japan KK;

SOLSPERSE-3000, 9000, 13000, 13240, 13650, 13940, 16000, 17000, 18000, 20000, 21000, 24000, 26000, 27000, 28000, 31845, 32000, 32500, 32550, 33500, 32600, 34750, 35100, 36600, 38500, 41000, 41090, 53095, 55000, 76500, and the like, manufactured by Lubrizol Japan Limited;

EFKA-46, 47, 48, 452, 4008, 4009, 4010, 4015, 4020, 4047, 4050, 4055, 4060, 4080, 4400, 4401, 4402, 4403, 4406, 4408, 4300, 4310, 4320, 4330, 4340, 450, 451, 453, 4540, 4550, 4560, 4800, 5010, 5065, 5066, 5070, 7500, 7554, 1101, 120, 150, 1501, 1502, 1503, and the like, manufactured by BASF Japan Ltd.; and AJISPER PA111, PB711, PB821, PB822, and PB824, manufactured by Ajinomoto Fine-Techno Co., Inc.

The content ratio of the light scattering agent (A) in the resin composition is, for example, based on the total solid content of the resin composition, 0.001% by mass or more and 50% by mass or less, and from the viewpoint of the developability of a layer formed from the resin composition and the outgoing light intensity (brightness) in the case where the resin layer is a wavelength conversion film and the viewpoint of increasing the dispersibility of the light scattering agent (A), preferably 1% by mass or more and 30% by mass or less, and more preferably 2% by mass or more and 10% by mass or less.

As used herein, the total amount of solid content means the total of the components contained in the resin composition, excluding the solvent (F) described later. The content ratio of each component in the solid content of the resin composition can be measured by a known analytical means such as liquid chromatography or gas chromatography. The content ratio of each component in the solid content of the resin composition may be calculated from formulation at the time of preparing the resin composition.

The content ratio of the light scattering agent (A) in the resin layer is, for example, based on the total amount of the resin layer, 0.001% by mass or more and 50% by mass or less, and from the viewpoint of the developability of the resin layer and the outgoing light intensity in the case where the resin layer is a wavelength conversion film and the viewpoint of increasing the dispersibility of the light scattering agent (A), preferably 1% by mass or more and 30% by mass or less, and more preferably 2% by mass or more and 10% by mass or less.

According to the present invention, it is possible to reduce the defect portion in the resin layer on the substrate layer and to obtain a layered body having good outgoing light characteristics although the resin layer contains the light scattering agent (A).

[2-2] Quantum Dots (B)

The resin composition may contain one or more kinds of quantum dots (B). When irradiated with ultraviolet light or visible light, a resin layer formed from the resin composition containing the quantum dots (B) can emit light having a wavelength different from that of the irradiation light. Therefore, the resin layer containing the quantum dots (B) can be used as a wavelength conversion film.

The quantum dots (B) are semiconductor fine particles having a particle size of 1 nm or more and 100 nm or less and absorb ultraviolet light or visible light and emit light by utilizing a band gap of the semiconductor.

Examples of the quantum dots (B) include compounds of Group 12 element and Group 16 element such as CdS, CdSe, CdTe, ZnS, ZnSe, ZnTe, HgS, HgSe, HgTe, CdHgTe, CdSeS, CdSeTe, CdSTe, ZnSeS, ZnSeTe, ZnSTe, HgSeS, HgSeTe, HgSTe, CdZnS, CdZnSe, CdZnSe, CdHgS, CdHgSe, CdHgTe, HgZnS, HgZnSe, HgZnSe, CdZnSeS, CdZnSeTe, CdZnSTe, CdHgSeS, CdHgSeTe, CdHgSTe, HgZnSeS, HgZnSeTe and HgZnSTe; compounds of Group 13 element and Group 15 element such as GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs and InAlPAs; compounds of Group 14 element and Group 16 element such as PdS and PbSe.

When the quantum dots (B) contain S or Se, the quantum dots surface-modified with a metal oxide or an organic substance may be used. By using the surface-modified quantum dots, it is possible to prevent S or Se from being extracted by a reaction component which is contained or may be contained in the resin composition.

The quantum dots (B) may form a core-shell structure by combining the above compounds. Examples of such a combination include fine particles having a core of CdSe and a shell of ZnS.

Since the energy state of the quantum dots (B) depends on its size, the emission wavelength can be freely selected by changing the particle size. For example, in the case of quantum dots composed of only CdSe, the peak wavelengths of the fluorescence spectrum when the particle sizes are 2.3 nm, 3.0 nm, 3.8 nm, and 4.6 nm are 528 nm, 570 nm, 592 nm, and 637 nm, respectively.

The light emitted from the quantum dots (B) has a narrow spectral width, and by combining the light having such a steep peak, it is possible to expand a displayable color gamut in a display device including a resin layer formed from the resin composition. Further, the quantum dots (B) have high responsiveness, and can efficiently utilize light emitted from a light source.

The resin composition may contain only one kind of quantum dots that emit light having a specific wavelength in response to light emitted from a light source, or may contain two or more kinds of quantum dots that emit light having different wavelengths in combination. Examples of the light having a specific wavelength include red light, green light, and blue light.

In the case where the resin composition contains the quantum dots (B), the content ratio of the quantum dots (B) in the resin composition is, for example, based on the total amount of the solid content of the resin composition, 1% by mass or more and 60% by mass or less, preferably 10% by mass or more and 50% by mass or less, and more preferably 10% by mass or more and 40% by mass or less.

In the case where the resin layer contains the quantum dots (B), the content ratio of the quantum dots (B) in the resin layer is, for example, based on the total amount of the resin layer, 1% by mass or more and 60% by mass or less, preferably 10% by mass or more and 50% by mass or less, and more preferably 10% by mass or more and 40% by mass or less.

[2-3] Organic Ligand

In the case where the resin composition contains the quantum dots (B), semiconductor particles that are the quantum dots (B) may be present in the resin composition in a state where the organic ligand is coordinated. Hereinafter, the semiconductor particles to which the organic ligand is coordinated are also referred to as ligand-containing semiconductor particles. The ligand to be coordinated to the semiconductor particles may be, for example, an organic compound having a polar group exhibiting a coordination ability based on the semiconductor particles. The organic ligand may be an organic ligand added for stabilization or due to synthetic restrictions on the ligand-containing semiconductor particles. For example, in National Publication of Japanese Patent Application No. 2015-529698, the ligand-containing semiconductor particles contain hexanoic acid as an organic ligand from the viewpoint of particle size control, and the organic ligand is replaced by DDSA (dodecenylsuccinic acid) for stabilization after synthesis.

The organic ligand can be coordinated, for example, to the surface of the semiconductor particle. The resin composition may contain one or more organic ligands.

The polar group is preferably at least one group selected from the group consisting of a thiol group (—SH), a carboxyl group (—COOH), and an amino group (—$NH_2$). The polar group selected from the group can be advantageous in increasing the coordination property to the semiconductor particles. The high coordination property can contribute to the improvement of the color unevenness of the resin layer (wavelength conversion film or the like) and/or the improvement of the patterning property of the resin composition. In particular, from the viewpoint of obtaining a resin layer (wavelength conversion film or the like) having better outgoing light characteristics, the polar group is more preferably at least one group selected from the group consisting of a thiol group and a carboxy group. The organic ligand may have one or more polar groups.

The organic ligand may be, for example, an organic compound represented by the following formula (X):

$$X^A—R^X \quad (X)$$

In the formula, $X^A$ is the above-mentioned polar group, and $R^X$ is a monovalent hydrocarbon group which may contain a heteroatom (N, O, S, halogen atom, or the like). The hydrocarbon group may have one or two or more unsaturated bonds such as carbon-carbon double bonds. The hydrocarbon group may have a linear, branched, or cyclic structure. The number of carbon atoms of the hydrocarbon group is, for example, 1 or more and 40 or less, and may be 1 or more and 30 or less. The methylene group contained in the hydrocarbon group is optionally replaced by —O—, —S—, —C(═O)—, —C(═O)—O—, —O—C(═O)—, —C(═O)—NH—, —NH—, or the like.

The group $R^X$ may contain a polar group. With respect to specific examples of the polar group, the above description relating to the polar group $X^A$ is referred to.

Specific examples of the organic ligand having a carboxy group as the polar group $X^A$ include formic acid, acetic acid, propionic acid, and saturated or unsaturated fatty acids. Specific examples of saturated or unsaturated fatty acids include saturated fatty acids such as butyric acid, pentanoic acid, caproic acid, caprylic acid, capric acid, lauric acid, myristic acid, pentadecylic acid, palmitic acid, margaric acid, stearic acid, arachidic acid, behenic acid, and lignoceric acid; monounsaturated fatty acids such as myristoleic acid, palmitoleic acid, oleic acid, icosenoic acid, erucic acid, and nervonic acid; and polyunsaturated fatty acids such as linoleic acid, α-linolenic acid, γ-linolenic acid, stearic acid, dihomo-γ-linolenic acid, arachidonic acid, eicosatetraenoic acid, docosadienoic acid, and adrenic acid (docosatetraenoic acid).

Specific examples of the organic ligand having a thiol group or an amino group as the polar group $X^A$ include organic ligands in which the carboxy group of the organic ligands having a carboxy group as the polar group $X^A$ exemplified above is replaced by a thiol group or an amino group.

Preferred examples of the organic ligand represented by the formula (X) include a compound (J-1) and a compound (J-2).

[Compound (J-1)]

The compound (J-1) is a compound having a first functional group and a second functional group. The first functional group is a carboxy group (—COOH) and the second functional group is a carboxy group or a thiol group (—SH). The compound (J-1) has a carboxy group and/or a thiol group, and can thus be a ligand coordinated to the quantum dots (B).

The resin composition may contain only one compound (J-1) or two or more thereof.

When the compound (J-1) is contained in the resin composition, the development speed of the resin composition can be sufficiently increased, and the outgoing light intensity of a resin layer (wavelength conversion film or the like) formed from the resin composition can be increased. It is considered that this is because both the carboxy group and the thiol group of the compound (J-1) can impart high developability with an alkali developer to the resin composition, and can be well coordinated to the quantum dots (B) to increase the dispersibility of the quantum dots (B) in the resin composition. In particular, the carboxy group has a higher effect of increasing the developability of the alkali developer, and the thiol group has a higher effect of increasing the dispersibility of the quantum dots (B).

Increasing the development speed of the resin composition can also contribute to increasing the outgoing light intensity of the resin layer (wavelength conversion film or the like). It is considered that this is because the permeation of water into the resin layer during the developing step can be suppressed.

An example of the compound (J-1) is a compound represented by the following formula (J-1a). The compound (J-1) may be an acid anhydride of the compound represented by the formula (J-1a):

[Formula 1]

(J-1a)

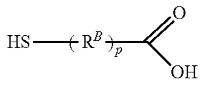

[In the formula, $R^B$ represents a divalent hydrocarbon group. A plurality of $R^B$, when present, are optionally the same or different. The hydrocarbon group may have one or more substituents. When there are a plurality of substituents, they may be the same or different, and they may be bonded to each other to form a ring together with the atoms to which they are bonded. —$CH_2$— contained in the hydrocarbon group is optionally replaced by at least one of —O—, —S—, —$SO_2$—, —CO—, and —NH—.

p represents an integer of 1 to 10.]

Examples of the divalent hydrocarbon group represented by $R^B$ include a chain hydrocarbon group, an alicyclic hydrocarbon group, and an aromatic hydrocarbon group.

Examples of the chain hydrocarbon group include a linear or branched alkanediyl group, and the number of carbon atoms thereof is usually 1 to 50, preferably 1 to 20, and more preferably 1 to 10.

Examples of the alicyclic hydrocarbon group include a monocyclic or polycyclic cycloalkanediyl group, and the number of carbon atoms thereof is usually 3 to 50, preferably 3 to 20, and more preferably 3 to 10.

Examples of the aromatic hydrocarbon group include a monocyclic or polycyclic arenediyl group, and the number of carbon atoms thereof is usually 6 to 20.

Examples of the substituent that the hydrocarbon group may have include an alkyl group having 1 to 50 carbon atoms, a cycloalkyl group having 3 to 50 carbon atoms, an aryl group having 6 to 20 carbon atoms, a carboxy group, an amino group, and a halogen atom.

The substituent that the hydrocarbon group may have is preferably a carboxy group, an amino group, or a halogen atom.

When $—CH_2—$ contained in the hydrocarbon group is replaced by at least one of —O—, —CO—, and —NH—, $—CH_2—$ is preferably replaced by at least one of —CO— and —NH—, and more preferably —NH—.

p is preferably 1 or 2.

Examples of the compound represented by the formula (J-1a) include compounds represented by the following formulas (1-1) to (1-9).

[Formula 2]

(1-1)

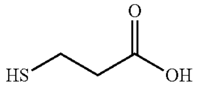

(1-2)

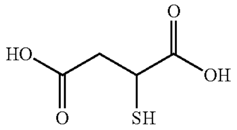

(1-3)

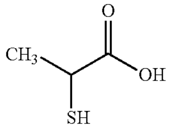

(1-4)

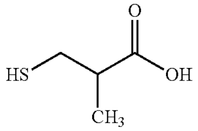

(1-5)

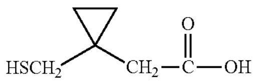

(1-6)

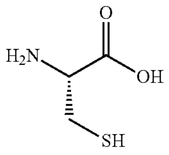

(1-7)

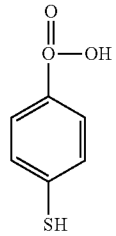

-continued (1-8)

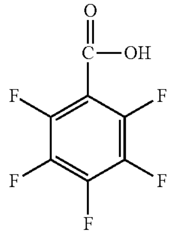

(1-9)

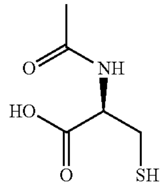

Specific examples of the compound represented by the formula (J-1a) include mercaptoacetic acid, 2-mercaptopropionic acid, 3-mercaptopropionic acid, 3-mercaptobutanoic acid, 4-mercaptobutanoic acid, mercaptosuccinic acid, mercaptostearic acid, mercaptooctanoic acid, 4-mercaptobenzoic acid, 2,3,5,6-tetrafluoro-4-mercaptobenzoic acid, L-cysteine, N-acetyl-L-cysteine, 3-methoxybutyl 3-mercaptopropionate, and 3-mercapto-2-methylpropionic acid.

Of these, 3-mercaptopropionic acid and mercaptosuccinic acid are preferable.

Another example of the compound (J-1) is a polycarboxylic acid compound, preferably a compound (J-1b) in which —SH in the formula (J-1a) is replaced by a carboxy group (—COOH) in the compound represented by the formula (J-1a).

Examples of the compound (J-1b) include the following compounds:

Succinic acid, glutaric acid, adipic acid, octafluoroadipic acid, azelaic acid, dodecanedioic acid, tetradecanedioic acid, hexadecanedioic acid, heptadecanedioic acid, octadecanedioic acid, nonadecandioic acid, dodecafluorosuberic acid, 3-ethyl-3-methylglutaric acid, hexafluoroglutaric acid, trans-3-hexenedioic acid, sebacic acid, hexadecafluorosebacic acid, acetylenedicarboxylic acid, trans-aconitic acid, 1,3-adamantandicarboxylic acid, bicyclo[2.2.2]octane-1,4-dicarboxylic acid, cis-4-cyclohexene-1,2-dicarboxylic acid, 1,1-cyclopropanedicarboxylic acid, 1,1-cyclobutanedicarboxylic acid, cis- or trans-1,3-cyclohexanedicarboxylic acid, cis- or trans-1,4-cyclohexanedicarboxylic acid, 1,1-cyclopentanediacetic acid, 1,2,3,4-cyclopentanetetracarboxylic acid, decahydro-1,4-naphthalenedicarboxylic acid, 2,3-norbornanedicarboxylic acid, 5-norbornene-2,3-dicarboxylic acid, phthalic acid, 3-fluorophthalic acid, isophthalic acid, tetrafluoroisophthalic acid, terephthalic acid, tetrafluoroterephthalic acid, 2,5-dimethylterephthalic acid, 2,6-naphthalenedicarboxylic acid, 2,3-naphthalenedicarboxylic acid, 1,4-naphthalenedicarboxylic acid, 1,1'-ferrocenedicarboxylic acid, 2,2'-biphenyldicarboxylic acid, 4,4'-biphenyldicarboxylic acid, 2,5-furandicarboxylic acid, benzophenone-2,4'-dicarboxylic acid monohydrate, benzophenone-4,4'-dicarboxylic acid, 2,3-pyrazinedicarboxylic acid, 2,3-pyridinedicarboxylic acid, 2,4-pyridinedicarboxylic acid, 3,5-pyridinedicarboxylic acid, 2,5-pyridinedicarboxylic acid, 2,6-pyridinedicarboxylic acid, 3,4-pyridinedicarboxylic acid, pyrazole-3,5-dicarboxylic acid monohydrate, 4,4'-stilbenedicarboxylic acid, anthraquinone-2,3-dicarboxylic acid, 4-(carboxymethyl)benzoic acid, chelidonic acid monohydrate, azobenzene-4,4'-dicarboxylic acid, azobenzene-3,3'-dicarboxylic acid, chlorendic acid, 1H-imidazole-4,5-dicarboxylic acid, 2,2-bis(4-carboxyphenyl) hexafluoropropane, 1,10-bis(4-carboxyphenoxy)decane, dipropylmalonic acid, dithiodiglycolic acid, 3,3'-dithiodipropionic acid, 4,4'-dithiodibutanoic acid, 4,4'-dicarboxydiphenyl ether, 4,4'-dicarboxydiphenyl sulfone, ethylene glycol bis(4-carboxyphenyl)ether, 3,4-ethylenedioxythiophene-2,5-dicarboxylic acid, 4,4'-isopropylidenediphenoxyacetic acid, 1,3-acetonedicarboxylic acid, methylenedisalicylic acid, 5,5'-thiodisalicylic acid, tris(2-carboxyethyl)isocyanurate, tetrafluorosuccinic acid, α,α,α',α'-tetramethyl-1,3-benzenedipropionic acid, and 1,3,5-benzenetricarboxylic acid.

The molecular weight of the compound (J-1) is preferably 3000 or less, more preferably 2000 or less, still more preferably 1000 or less, yet still more preferably 800 or less, and particularly preferably 500 or less, from the viewpoint of increasing the development speed of the resin composition and from the viewpoint of increasing the outgoing light intensity of the resin layer (wavelength conversion film or the like). The molecular weight of the compound (J-1) is usually 100 or more.

The molecular weight may be a number-average molecular weight or a weight-average molecular weight. In this case, the number-average molecular weight and the weight-average molecular weight are a number-average molecular weight and a weight-average molecular weight in terms of standard polystyrene measured by gel permeation chromatography (GPC), respectively.

In the resin composition, at least a part of the molecules of the compound (J-1) is preferably coordinated to the quantum dots (B), and all or almost all the molecules may be coordinated to the quantum dots (B). That is, the resin composition preferably contains a compound (J-1) coordinated to the quantum dots (B), but may also contain a compound (J-1) not coordinated to the quantum dots (B) and a compound (J-1) coordinated to the quantum dots (B).

Including the compound (J-1) coordinated to the quantum dots (B) can be advantageous from the viewpoint of increasing the development speed of the resin composition and from the viewpoint of increasing the outgoing light intensity of a resin layer (wavelength conversion film or the like). Usually, the compound (J-1) can be coordinated to the quantum dots (B) via the first functional group and/or the second functional group. The compound (J-1) can be coordinated to the surface of the quantum dots (B), for example.

In the case where the resin composition contains the quantum dots (B) and the compound (J-1), the ratio of contents of the compound (J-1) to the quantum dots (B) in the resin composition is preferably 0.001 or more and 1 or less, more preferably 0.01 or more and 0.5 or less, and still more preferably 0.02 or more and 0.1 or less in terms of mass ratio. When the ratio of contents is in this range, it may be advantageous from the viewpoint of increasing the development speed of the resin composition and from the viewpoint of increasing the outgoing light intensity of the resin layer (wavelength conversion film or the like).

In the case where the resin composition contains the compound (J-1), the content ratio of the compound (J-1) in the resin composition is preferably 0.1% by mass or more and 20% by mass or less, more preferably 0.1% by mass or more and 10% by mass or less, still more preferably 0.2% by mass or more and 8% by mass or less, yet still more preferably 0.2% by mass or more and 5% by mass or less, and particularly preferably 0.5% by mass or more and 4% by mass or less, based on the total amount of the solid content of the resin composition, from the viewpoint of increasing the development speed of the resin composition and increasing the outgoing light intensity of the resin layer (wavelength conversion film or the like).

[Compound (J-2)]

The compound (J-2) is a compound (J-2) different from the compound (J-1), and is a compound having a polyalkylene glycol structure and having a polar group at the molecular end. The molecular end is preferably the end of the longest carbon chain in the compound (J-2) (the carbon atom in the carbon chain is optionally replaced by another atom such as an oxygen atom).

The resin composition may contain only one compound (J-2) or two or more thereof.

Compounds having a polyalkylene glycol structure and having the first functional group and the second functional group are considered to belong to the compound (J-1).

From the viewpoint of increasing the development speed of the resin composition and from the viewpoint of increasing the outgoing light intensity of a resin layer (wavelength conversion film or the like), the resin composition may contain the compound (J-1) or the compound (J-2), or may contain the compound (J-1) and the compound (J-2).

The polyalkylene glycol structure refers to a structure represented by the following formula:

[Formula 3]

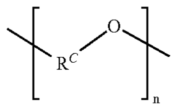

wherein n is an integer of 2 or more. In the formula, $R^C$ is an alkylene group, and examples thereof include an ethylene group and a propylene group.

Specific examples of the compound (J-2) include a polyalkylene glycol-based compound represented by the following formula (J-2a).

[Formula 4]

(J-2a)

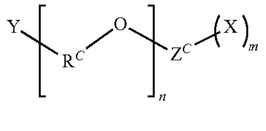

In the formula (J-2a), X is a polar group, Y is a monovalent group, and $Z^C$ is a divalent or trivalent group. n is an integer of 2 or more. m is 1 or 2. $R^C$ is an alkylene group.

In the resin composition, at least a part of the molecules of the compound (J-2) is preferably coordinated to the quantum dots (B), and all or almost all the molecules may be coordinated to the quantum dots (B). That is, the resin composition preferably contains a compound (J-2) coordinated to the quantum dots (B), but may also contain a compound (J-2) not coordinated to the quantum dots (B) and a compound (J-2) coordinated to the quantum dots (B).

Including the compound (J-2) coordinated to the quantum dots (B) can be advantageous from the viewpoint of increasing the development speed of the resin composition and from the viewpoint of increasing the outgoing light intensity of a resin layer (wavelength conversion film or the like). Usually, the compound (J-2a) can be coordinated to the quantum dots (B) via the polar group X. When the group Y contains a polar group, the compound (J-2a) may be coordinated to the quantum dots (B) via the polar group of the group Y, or via the polar group X and the polar group of the group Y. The compound (J-2) can be coordinated to the surface of the quantum dots (B), for example.

The polar group X is preferably at least one group selected from the group consisting of a thiol group (—SH), a carboxy group (—COOH), and an amino group (—$NH_2$). The polar group selected from the group can be advantageous in increasing the coordination property to the quantum dots (B). In particular, from the viewpoint of increasing the outgoing light intensity of a resin layer (wavelength conversion film or the like), the polar group X is more preferably at least one group selected from the group consisting of a thiol group and a carboxy group.

The group Y is a monovalent group. The group Y is not particularly limited, and examples thereof include a monovalent hydrocarbon group which may have a substituent (N, O, S, halogen atom, or the like). —$CH_2$— contained in the hydrocarbon group is optionally replaced by —O—, —S—, —C(═O)—, —C(═O)—O—, —O—C(═O)—, —C(═O)—NH—, —NH—, or the like.

The number of carbon atoms of the hydrocarbon group is, for example, 1 or more and 12 or less. The hydrocarbon group may have an unsaturated bond.

Examples of the group Y include an alkyl group having a linear, branched, or cyclic structure having 1 or more and 12 or less carbon atoms; and an alkoxy group having a linear, branched, or cyclic structure having 1 or more and 12 or less carbon atoms. The number of carbon atoms of the alkyl group and the alkoxy group is preferably 1 or more and 8 or less, more preferably 1 or more and 6 or less, and still more preferably 1 or more and 4 or less. —$CH_2$— contained in the alkyl group and the alkoxy group is optionally replaced by —O—, —S—, —C(═O)—, —C(═O)—O—, —O—C(═O)—, —C(═O)—NH—, —NH—, or the like. In particular, the group Y is preferably a linear or branched alkoxy group having 1 or more and 4 or less carbon atoms, and more preferably a linear alkoxy group having 1 or more and 4 or less carbon atoms.

The group Y may contain a polar group. Examples of the polar group include at least one group selected from the group consisting of a thiol group (—SH), a carboxy group (—COOH), and an amino group (—$NH_2$). However, as described above, compounds having a polyalkylene glycol structure and having the first functional group and the second functional group are considered to belong to the compound (J-1). The polar group is preferably located at the end of the group Y.

The group $Z^C$ is a divalent or trivalent group. The group $Z^C$ is not particularly limited, and examples thereof include a divalent or trivalent hydrocarbon group which may contain a heteroatom (N, O, S, halogen atom, or the like). The number of carbon atoms of the hydrocarbon group is, for example, 1 or more and 24 or less. The hydrocarbon group may have an unsaturated bond.

Examples of the group $Z^C$ which is a divalent group include an alkylene group having a linear, branched, or cyclic structure having 1 or more and 24 or less carbon atoms; and an alkenylene group having a linear, branched, or cyclic structure having 1 or more and 24 or less carbon atoms. The number of carbon atoms of the alkyl group and the alkenylene group is preferably 1 or more and 12 or less, more preferably 1 or more and 8 or less, and still more preferably 1 or more and 4 or less. —$CH_2$— contained in the alkyl group and the alkenylene group is optionally replaced by —O—, —S—, —C(═O)—, —C(═O)—O—, —O—C(═O)—, —C(═O)—NH—, —NH—, or the like.

Examples of the group $Z^C$ which is a trivalent group include a group obtained by removing one hydrogen atom from the group $Z^C$ which is a divalent group described above.

The group $Z^C$ may have a branched structure. The group $Z^C$ having a branched structure may have a polyalkylene glycol structure different from the polyalkylene glycol structure represented by the formula (J-2a) in a branched chain different from the branched chain including the polyalkylene glycol structure represented by the formula (J-2a).

In particular, the group $Z^C$ is preferably a linear or branched alkylene group having 1 or more and 6 or less carbon atoms, and more preferably a linear alkylene group having 1 or more and 4 or less carbon atoms.

$R^C$ is an alkylene group, and is preferably a linear or branched alkylene group having 1 or more and 6 or less carbon atoms, and more preferably a linear alkylene group having 1 or more and 4 or less carbon atoms.

n in the formula (J-2a) is an integer of 2 or more, preferably 2 or more and 540 or less, more preferably 2 or more and 120 or less, and still more preferably 2 or more and 60 or less.

The molecular weight of the compound (J-2) may be, for example, about 150 or more and 10000 or less, but is preferably 150 or more and 5000 or less and more preferably 150 or more and 4000 or less from the viewpoint of increasing the development speed of the resin composition and from the viewpoint of increasing the outgoing light intensity of a resin layer (wavelength conversion film or the like).

The molecular weight may be a number-average molecular weight or a weight-average molecular weight. In this case, the number-average molecular weight and the weight-average molecular weight are a number-average molecular weight and a weight-average molecular weight in terms of standard polystyrene measured by GPC, respectively.

In the case where the resin composition contains the quantum dots (B) and the compound (J-2), the ratio of contents of the compound (J-2) to the quantum dots (B) in the resin composition is preferably 0.001 or more and 2 or less, more preferably 0.01 or more and 1.5 or less, and still more preferably 0.1 or more and 1 or less in terms of mass ratio. When the ratio of contents is in this range, it may be advantageous from the viewpoint of increasing the development speed of the resin composition and from the viewpoint of increasing the outgoing light intensity of the resin layer (wavelength conversion film or the like).

In the case where the resin composition contains the compound (J-2), the content ratio of the compound (J-2) in the resin composition is preferably 0.1% by mass or more and 40% by mass or less, more preferably 0.1% by mass or more and 20% by mass or less, still more preferably 1% by mass or more and 15% by mass or less, yet still more preferably 2% by mass or more and 10% by mass or less, based on the total amount of the solid content of the resin composition, from the viewpoint of increasing the development speed of the resin composition and increasing the outgoing light intensity of the resin layer (wavelength conversion film or the like).

In the case where the resin composition contains the compound (J-1) and the compound (J-2), the ratio of contents of the compound (J-2) to the compound (J-1) in the resin composition is preferably 1 or more and 50 or less, more preferably 5 or more and 40 or less, and still more preferably 10 or more and 25 or less in terms of mass ratio. When the ratio of contents is in this range, it may be advantageous from the viewpoint of increasing the development speed of the resin composition and from the viewpoint of increasing the outgoing light intensity of the resin layer (wavelength conversion film or the like).

The resin composition may further contain a compound (J-3) having a coordination ability based on the quantum dots (B) that is a compound other than the compound (J-1) and the compound (J-2).

Examples of the compound (J-3) include organic acids, organic amine compounds, thiol compounds, and the like. The compound (J-3) may be silicone oil or the like modified by a carboxy group and an amino group or a thiol group, and, when such a compound (J-3) is contained in the resin composition, the characteristics (surface characteristics such as surface tension σr, contact angle θr and the like) of the resin layer can be adjusted.

In the case where the resin composition contains the quantum dots (B) and the compound (J-3), the ratio of contents of the compound (J-3) to the quantum dots (B) in the resin composition is preferably 0.001 or more and 2 or less, more preferably 0.01 or more and 1.5 or less, and still more preferably 0.1 or more and 1 or less in terms of mass ratio. When the ratio of contents is in this range, it may be advantageous from the viewpoint of increasing the development speed of the resin composition and from the viewpoint of increasing the outgoing light intensity of the resin layer (wavelength conversion film or the like).

In the case where the resin composition contains the compound (J-3), the content ratio of the compound (J-3) in the resin composition is preferably 0.1% by mass or more and 40% by mass or less, more preferably 0.1% by mass or more and 20% by mass or less, still more preferably 0.2% by mass or more and 15% by mass or less, yet still more preferably 0.2% by mass or more and 10% by mass or less, based on the total amount of the solid content of the resin composition, from the viewpoint of increasing the development speed of the resin composition and increasing the outgoing light intensity of the resin layer (wavelength conversion film or the like).

As the compound (J-3), the light scattering agent (A), the resin (C), the photopolymerizable compound (D), the photopolymerization initiator (E), a photopolymerization initiation aid (E1), the solvent (F), an antioxidant (G), and the leveling agent (H) are not included.

The resin composition may contain the organic ligand even in the case of not containing the quantum dots (B). When the organic ligand is contained in the resin composition, the characteristics (surface characteristics such as the surface tension σr and the contact angle θr and the like) of the resin layer can be adjusted.

[2-4] Resin (C)

The resin composition contains one or more resins (C). Examples of the resin (C) include the following resins [K1] to [K4]:

- resin [K1]: copolymer of at least one (a) (hereinafter also referred to as "(a)") selected from the group consisting of an unsaturated carboxylic acid and an unsaturated carboxylic acid anhydride and a monomer (c) (hereinafter also referred to as "(c)") copolymerizable with (a) (but different from (a));
- resin [K2]: resin obtained by reacting a copolymer of (a) and (c) with a monomer (b) (hereinafter also referred to as "(b)") having a cyclic ether structure having 2 to 4 carbon atoms and an ethylenically unsaturated bond;
- resin [K3]: resin obtained by reacting a copolymer of (b) and (c) with (a); and
- resin [K4]: resin obtained by reacting a copolymer of (b) and (c) with (a) and further reacting with a carboxylic acid anhydride.

Examples of (a) include unsaturated monocarboxylic acids such as (meth)acrylic acid, crotonic acid, and o-, m-, and p-vinylbenzoic acid;

- unsaturated dicarboxylic acids such as maleic acid, fumaric acid, citraconic acid, mesaconic acid, itaconic acid, 3-vinylphthalic acid, 4-vinylphthalic acid, 3,4,5,6-tetrahydrophthalic acid, 1,2,3,6-tetrahydrophthalic acid, dimethyltetrahydrophthalic acid, and 1,4-cyclohexenedicarboxylic acid;
- bicyclo unsaturated compounds containing a carboxy group, such as methyl-5-norbornene-2,3-dicarboxylic acid, 5-carboxybicyclo[2.2.1]hept-2-ene, 5,6-dicarboxybicyclo[2.2.1]hept-2-ene, 5-carboxy-5-methylbicyclo[2.2.1]hept-2-ene, 5-carboxy-5-ethylbicyclo[2.2.1]hept-2-ene, 5-carboxy-6-methylbicyclo[2.2.1]hept-2-ene, and 5-carboxy-6-ethylbicyclo[2.2.1]hept-2-ene;
- unsaturated dicarboxylic acid anhydrides such as maleic anhydride, citraconic anhydride, itaconic anhydride, 3-vinylphthalic anhydride, 4-vinylphthalic anhydride, 3,4,5,6-tetrahydrophthalic anhydride, 1,2,3,6-tetrahydrophthalic anhydride, dimethyltetrahydrophthalic anhydride, 5,6-dicarboxybicyclo[2.2.1]hept-2-ene anhydride;
- unsaturated mono[(meth)acryloyloxyalkyl]esters of di- or higher polycarboxylic acids such as mono[2-(meth)acryloyloxyethyl]succinate and mono[2-(meth)acryloyoxyethyl]phthalate; and
- unsaturated (meth)acrylates containing a hydroxy group and a carboxy group in the same molecule, such as α-(hydroxymethyl) (meth)acrylic acid.

Of these, (meth) acrylic acid, maleic anhydride and the like are preferable from the viewpoint of copolymerization reactivity and solubility of the obtained resin (C) in an alkaline aqueous solution.

As used herein, the term (meth)acrylic acid means acrylic acid and/or methacrylic acid. The same applies to "(meth)acryloyl", "(meth)acrylate" and the like.

(b) is, for example, a monomer having a cyclic ether structure having 2 to 4 carbon atoms (for example, at least one selected from the group consisting of an oxirane ring, an oxetane ring, and a tetrahydrofuran ring) and an ethylenically unsaturated bond. (b) is preferably a monomer having a cyclic ether structure having 2 to 4 carbon atoms and a (meth)acryloyloxy group.

Examples of (b) include monomers having an oxirane ring and an ethylenically unsaturated bond, such as glycidyl (meth)acrylate, β-methylglycidyl (meth)acrylate, β-ethylglycidyl (meth)acrylate, glycidyl vinyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-bis(glycidyloxymethyl)styrene, 2,4-bis(glycidyloxymethyl)styrene, 2,5-bis(glycidyloxymethyl) styrene, 2,6-bis(glycidyloxymethyl)styrene, 2,3,4-tris (glycidyloxymethyl) styrene, 2,3,5-tris(glycidyloxymethyl) styrene, 2,3,6-tris(glycidyloxymethyl) styrene, 3,4,5-tris (glycidyloxymethyl)styrene, and 2,4,6-tris (glycidyloxymethyl) styrene;

- monomers having an oxetane ring and an ethylenically unsaturated bond, such as 3-methyl-3-methacryloyloxymethyloxetane, 3-methyl-3-acryloyloxymethyloxetane, 3-ethyl-3-methacryloyloxymethyloxetane, 3-ethyl-3-acryloyloxymethyloxetane, 3-methyl-3-methacryloyloxyethyloxetane, 3-methyl-3-acryloyloxyethyloxetane, 3-ethyl-3-methacryloyloxyethyloxetane, and 3-ethyl-3-acryloyloxyethyloxetane; and monomers having a tetrahydrofuran ring and an ethylenically unsaturated bond, such as tetrahydrofurfuryl acrylate (for example, Viscoat V #150, manufactured by OSAKA ORGANIC CHEMICAL INDUSTRY LTD.) and tetrahydrofurfuryl methacrylate.

(b) is preferably a monomer having an oxirane ring and an ethylenically unsaturated bond, because the reactivity during the production of the resins [K2] to [K4] is high and unreacted (b) hardly remains.

Examples of (c) include (meth)acrylic esters such as methyl (meth)acrylate, ethyl (meth)acrylate, n-butyl (meth) acrylate, sec-butyl (meth)acrylate, tert-butyl (meth)acrylate, 2-ethylhexyl (meth)acrylate, dodecyl (meth)acrylate, lauryl (meth)acrylate, stearyl (meth)acrylate, cyclopentyl (meth) acrylate, cyclohexyl (meth)acrylate, 2-methylcyclohexyl (meth)acrylate, tricyclo[5.2.1.$0^{2,6}$]decan-8-yl (meth)acrylate (referred to as "dicyclopentanyl (meth)acrylate" (common name) in the art. Or sometimes referred to as "tricyclodecyl (meth)acrylate"), tricyclo[5.2.1.$0^{2,6}$]decen-8-yl (meth)acrylate (which is referred to as "dicyclopentenyl (meth)acrylate" (common name) in the art), dicyclopentanyloxyethyl (meth)acrylate, isobornyl (meth)acrylate, adamantyl (meth)acrylate, allyl (meth)acrylate, propargyl (meth)acrylate, phenyl (meth)acrylate, naphthyl (meth)acrylate, and benzyl (meth)acrylate;

hydroxy group-containing (meth)acrylic esters such as 2-hydroxyethyl (meth)acrylate and 2-hydroxypropyl (meth)acrylate;

dicarboxylic diesters such as diethyl maleate, diethyl fumarate, and diethyl itaconate;

bicyclo unsaturated compounds such as bicyclo[2.2.1] hept-2-ene, 5-methylbicyclo[2.2.1]hept-2-ene, 5-ethylbicyclo[2.2.1]hept-2-ene, 5-hydroxybicyclo[2.2.1] hept-2-ene, 5-hydroxymethylbicyclo[2.2.1]hept-2-ene, 5-(2'-hydroxyethyl)bicyclo[2.2.1]hept-2-ene, 5-methoxybicyclo[2.2.1]hept-2-ene, 5-ethoxybicyclo [2.2.1]hept-2-ene, 5,6-dihydroxybicyclo[2.2.1]hept-2-ene, 5,6-di(hydroxymethyl)bicyclo[2.2.1]hept-2-ene, 5,6-di(2'-hydroxyethyl)bicyclo[2.2.1]hept-2-ene, 5,6-dimethoxybicyclo[2.2.1]hept-2-ene, 5,6-diethoxybicyclo[2.2.1]hept-2-ene, 5-hydroxy-5-methylbicyclo [2.2.1]hept-2-ene, 5-hydroxy-5-ethylbicyclo[2.2.1] hept-2-ene, 5-hydroxymethyl-5-methylbicyclo[2.2.1] hept-2-ene, 5-tert-butoxycarbonylbicyclo[2.2.1]hept-2-ene, 5-cyclohexyloxycarbonylbicyclo[2.2.1]hept-2-ene, 5-phenoxycarbonylbicyclo[2.2.1]hept-2-ene, 5,6-bis(tert-butoxycarbonyl)bicyclo[2.2.1]hept-2-ene, and 5,6-bis(cyclohexyloxycarbonyl)bicyclo[2.2.1]hept-2-ene;

dicarbonylimide derivatives such as N-phenylmaleimide, N-cyclohexylmaleimide, N-benzylmaleimide, N-succinimidyl-3-maleimidobenzoate, N-succinimidyl-4-maleimidobutyrate, N-succinimidyl-6-maleimide caproate, N-succinimidyl-3-maleimide propionate, and N-(9-acridinyl)maleimide; and styrene, α-methylstyrene, m-methylstyrene, p-methylstyrene, vinyltoluene, p-methoxystyrene, acrylonitrile, methacrylonitrile, vinyl chloride, vinylidene chloride, acrylamide, methacrylamide, vinyl acetate, 1,3-butadiene, isoprene, and 2,3-dimethyl-1,3-butadiene.

Among these, from the viewpoint of copolymerization reactivity and heat resistance of the resin (C), styrene, vinyltoluene, N-phenylmaleimide, N-cyclohexylmaleimide, N-benzylmaleimide, bicyclo[2.2.1]hept-2-ene and the like are preferable.

In the resin [K1], the ratio of the structural unit derived from each of (a) and (c) in the total structural units constituting the resin [K1] is preferably the following:

the structural unit derived from (a): 2 mol % or more and 60 mol % or less; and the structural unit derived from (c): 40 mol % or more and 98 mol % or less and more preferably the following:

the structural unit derived from (a): 10 mol % or more and 50 mol % or less; and the structural unit derived from (c): 50 mol % or more and 90 mol % or less.

When the ratio of the structural units of the resin [K1] is within the above range, the resin composition tends to be excellent in storage stability, developability and solvent resistance of the obtained resin layer.

The resin [K1] can be produced with reference to the method disclosed in for example, a document "Experimental Method for Polymer Synthesis" (edited by Takayuki Otsu, published by Kagaku-Dojin Publishing Company, INC, First Edition, First Printed on Mar. 1, 1972) and cited documents described in the above-mentioned document.

Specific examples thereof include the following method: predetermined amounts of (a) and (c), a polymerization initiator, a solvent and the like are placed in a reaction vessel; for example, a deoxidization atmosphere is formed by replacing oxygen with nitrogen; and these are heated or kept warm during stirring.

The polymerization initiator, the solvent and the like which are used here are not particularly limited, and those commonly used in the art can be used. Examples of the polymerization initiator include azo compounds (2,2'-azobisisobutyronitrile, 2,2'-azobis(2,4-dimethylvaleronitrile) and the like) and organic peroxides (benzoyl peroxide and the like), and the solvent may be a solvent capable of dissolving each monomer, and examples of the solvent (F) that can be contained in the resin composition include solvents to be described later.

A solution after a reaction, of the resultant copolymer may be used as it is; a concentrated or diluted solution of the copolymer may be used; or a solid (powder) taken out from the copolymer by a method such as reprecipitation may be used. When the solvent (F) described later is used as the solvent for the polymerization, the solution after the reaction can be used as it is for the preparation of the resin composition, whereby the producing process of the resin composition can be simplified.

The resin [K2] can be produced by adding a cyclic ether having 2 to 4 carbon atoms of (b) to the copolymer of (a) and (c), that is, to a carboxylic acid and/or a carboxylic acid anhydride of (a).

The copolymer of (a) and (c) is first produced in the same manner as in the method described as the method for producing the resin [K1]. In this case, the ratio of the structural unit derived from each of (a) and (c) is preferably the same ratio as that described in the resin [K1].

Next, a cyclic ether having 2 to 4 carbon atoms of (b) is reacted with a part of the carboxylic acid and/or the carboxylic acid anhydride derived from (a) in the copolymer.

Subsequent to the production of the copolymer of (a) and (c), the resin [K2] can be produced by replacing a nitrogen atmosphere in a flask with air, and reacting (b) in the presence of a reaction catalyst for a carboxylic acid or a carboxylic acid anhydride and a cyclic ether (for example, an organic phosphorus compound, a metallic complex, or an amine compound), and a polymerization inhibitor (for example, hydroquinone and the like), for example, at 60° C. or more and 130° C. or less for 1 to 10 hours.

The amount of (b) used is preferably 5 mol or more and 80 mol or less, and more preferably 10 mol or more and 75 mol or less, based on 100 mol of (a). Within this range, the storage stability of the resin composition, the developability of the obtained resin layer, and the solvent resistance, heat resistance, and mechanical strength of the resin layer tend to be well balanced.

Examples of the organic phosphorus compound as a reaction catalyst include triphenylphosphine. As the amine compound as the reaction catalyst, for example, an aliphatic tertiary amine compound or an aliphatic quaternary ammonium salt compound can be used, and specific examples thereof include tris(dimethylaminomethyl)phenol, triethylamine, tetrabutylammonium bromide, and tetrabutylammonium chloride. From the viewpoint of the developability of the resin layer and the outgoing light intensity of a wavelength conversion film described later in the case where the resin layer is the wavelength conversion film, the reaction catalyst is preferably an organic phosphorus compound.

The amount of the reaction catalyst used is preferably 0.001 part by mass or more and 5 parts by mass or less based on 100 parts by mass of the total amount of (a), (b), and (c).

The amount of the polymerization inhibitor used is preferably 0.001 part by mass or more and 5 parts by mass or less based on 100 parts by mass of the total amount of (a), (b), and (c).

The reaction conditions such as the charging method, the reaction temperature and the time can be appropriately adjusted in consideration of the production equipment, the amount of heat generated by the polymerization, and the like. In the same manner as the polymerization conditions, the charging method and the reaction temperature can be appropriately adjusted in consideration of the production equipment, the amount of heat generated by the polymerization, and the like.

The resin [K3] is produced by producing a copolymer of (b) and (c) in the same manner as in the above-mentioned method for producing the resin [K1] as a first step. In the same manner as in the above, a solution after a reaction, of the resultant copolymer may be used as it is; a concentrated or diluted solution of the copolymer may be used; or a solid (powder) taken out from the copolymer by a method such as reprecipitation may be used.

The ratio of the structural unit derived from each of (b) and (c) based on the total number of moles of the total structural units constituting the copolymer is preferably the following:

- the structural unit derived from (b): 5 mol % or more and 95 mol % or less; and
- the structural unit derived from (c): 5 mol % or more and 95 mol % or less and more preferably the following:

- the structural unit derived from (b): 10 mol % or more and 90 mol % or less; and
- the structural unit derived from (c): 10 mol % or more and 90 mol % or less.

The resin [K3] can be produced by reacting a carboxylic acid or a carboxylic acid anhydride of (a) with the cyclic ether derived from (b) contained in the copolymer of (b) and (c) under the same conditions as those of the method for producing the resin [K2].

The amount of (a) used which is reacted with the copolymer is preferably 5 mol or more and 80 mol or less based on 100 mol of (b).

The resin [K4] is a resin obtained by further reacting the resin [K3] with a carboxylic acid anhydride. A carboxylic acid anhydride is reacted with a hydroxy group generated by a reaction between a cyclic ether and a carboxylic acid or a carboxylic anhydride.

Examples of the carboxylic acid anhydride include maleic anhydride, citraconic anhydride, itaconic anhydride, 3-vinylphthalic anhydride, 4-vinylphthalic anhydride, 3,4,5,6-tetrahydrophthalic anhydride, 1,2,3,6-tetrahydrophthalic anhydride, dimethyltetrahydrophthalic anhydride, 5,6-dicarboxybicyclo[2.2.1]hept-2-ene anhydride.

The amount of the carboxylic acid anhydride used is preferably 0.5 mol or more and 1 mol or less based on 1 mol of the amount used in (a).

Specific examples of the resin [K1], the resin [K2], the resin [K3], and the resin [K4] include a resin [K1] such as a benzyl (meth)acrylate/(meth)acrylic acid copolymer and a styrene/(meth)acrylic acid copolymer;

- a resin [K2] such as a resin produced by adding glycidyl (meth)acrylate to a benzyl (meth)acrylate/(meth)acrylic acid copolymer, a resin produced by adding glycidyl (meth)acrylate to a tricyclodecyl (meth)acrylate/styrene/(meth)acrylic acid copolymer, or a resin produced by adding glycidyl (meth)acrylate to a tricyclodecyl (meth)acrylate/benzyl (meth)acrylate/(meth)acrylic acid copolymer; a resin [K3] such as a resin produced by reacting a tricyclodecyl (meth)acrylate/glycidyl (meth)acrylate copolymer with (meth)acrylic acid or a resin produced by reacting a tricyclodecyl (meth)acrylate/styrene/glycidyl (meth)acrylate copolymer with (meth)acrylic acid; and a resin [K4] such as a resin produced by reacting a tricyclodecyl (meth)acrylate/glycidyl (meth)acrylate copolymer with (meth)acrylic acid to produce a resin and then reacting this resin with tetrahydrophthalic anhydride.

In particular, the resin (C) preferably contains at least one selected from the group consisting of the resin [K2], the resin [K3], and the resin [K4].

As a further example of the resin (C), the alkali-soluble resin disclosed in Japanese Patent Laid-Open No. 2018-123274 can be mentioned.

The resin (C) can include one or more selected from the group consisting of the resin [K1], resin [K2], resin [K3], resin [K4] described above and the alkali-soluble resin disclosed in Japanese Patent Laid-Open No. 2018-123274.

Additional examples of the resin (C) include polyalkylene glycol compounds. Examples of the polyalkylene glycol compounds include polyethylene glycol, polypropylene glycol and the like. The polyalkylene glycol compounds are advantageous in increasing the dispersibility of the quantum dots (B) in the resin composition in the case where the resin composition further contains the quantum dots (B).

The resin (C) preferably has a weight-average molecular weight of 9000 or less in terms of standard polystyrene measured by GPC. When the resin (C) has the above weight-average molecular weight, it is possible to improve the development speed of the resin layer, and, in the case where the resin layer is a wavelength conversion film, a wavelength conversion film having a high outgoing light intensity can be obtained.

The weight-average molecular weight of the resin (C) in terms of standard polystyrene is, for example, 1000 or more and 9000 or less, and from the viewpoints of the development speed of the resin layer and the outgoing light intensity of the wavelength conversion film, preferably 2000 or more and 8500 or less and more preferably 3000 or more and 8500 or less.

The weight-average molecular weight of the resin (C) in terms of standard polystyrene is measured according to the measurement method described in the section of Examples below.

The weight-average molecular weight of the resin (C) can be adjusted within the above range by appropriately combining the selection of raw materials to be used, a charging method, and reaction conditions such as reaction temperature and time.

The molecular weight distribution [weight-average molecular weight (Mw)/number-average molecular weight (Mn)] of the resin (C) measured by GPC is, for example, 1.0 or more and 6.0 or less, and preferably 1.2 or more and 4.0 or less from the viewpoint of developability of the resin layer.

The acid value of the resin (C) is preferably 90 mg KOH/g or more and 150 mg KOH/g or less based on the solid content. When the acid value is less than 90 mg KOH/g, the solubility of the resin layer in an alkali developer may be lowered and a residue may be left on the substrate, and when the acid value is more than 150 mg KOH/g, peeling of the resin layer after development is more likely to occur.

The acid value of the resin (C) is preferably 95 mg KOH/g or more and 140 mg KOH/g or less, more preferably 100 mg KOH/g or more and 130 mg KOH/g or less, from the viewpoint of the developability of the resin layer.

The acid value is a value measured as the amount (mg) of potassium hydroxide necessary for neutralizing 1 g of the resin (C), and can be obtained by titrating with, for example, an aqueous potassium hydroxide solution. The acid value of the resin (C) is measured according to the measurement method described in the section of Examples below.

The resin (C) may contain a resin having a double bond equivalent of, for example, 300 g/eq or more and 2000 g/eq or less, preferably 500 g/eq or more and 1500 g/eq or less. Since the resin (C) contains a resin having a double bond equivalent of 300 g/eq or more and 2000 g/eq or less, the phenomenon of being quenched during the step of producing the cured pattern tends to be easily prevented. When the resin (C) contains a resin having a double bond equivalent exceeding 2000 g/eq, the ability of the resin (C) to effectively protect the quantum dots (B) tends to decrease. When the resin (C) contains a resin having a double bond equivalent of less than 300 g/eq, the cured pattern tends to be easily peeled off without being dissolved during development.

Examples of the resin having a double bond equivalent of 300 g/eq or more and 2000 g/eq or less include (meth)acrylic resins. The resin (C) is preferably composed of a (meth) acrylic resin.

In the case where the resin composition contains the light scattering agent (A), but does not contain the quantum dots (B), the content ratio of the resin (C) in the resin composition is, for example, based on the total amount of the solid content of the resin composition, 5% by mass or more and 80% by mass or less, preferably 10% by mass or more and 70% by mass or less, and more preferably 15% by mass or more and 65% by mass or less. When the content ratio of the resin (C) is within the above range, the light scattering agent (A) tends to be easily dispersed and the outgoing light intensity tends to be easily maintained at a high level during the step of producing a cured pattern.

In the case where the resin composition contains the light scattering agent (A) and the quantum dots (B), the content ratio of the resin (C) in the resin composition is, for example, based on the total amount of the solid content of the resin composition, 5% by mass or more and 80% by mass or less, preferably 10% by mass or more and 65% by mass or less, and more preferably 15% by mass or more and 45% by mass or less. When the content ratio of the resin (C) is within the above range, the light scattering agent (A) and the quantum dots (B) tend to be easily dispersed and the outgoing light intensity tends to be easily maintained at a high level during the step of producing a cured pattern described later.

In the case where the resin composition further contains a photopolymerizable compound (D) described later together with the light scattering agent (A), but does not contain the quantum dots (B), the mass ratio (solid content ratio) of the resin (C) to the photopolymerizable compound (D) is, for example, 1 or more and preferably 1.5 or more and 3.5 or less from the viewpoint of the developability of the resin layer.

In the case where the resin composition contains the light scattering agent (A), the quantum dots (B), and the photopolymerizable compound (D), the mass ratio (solid content ratio) of the resin (C) to the photopolymerizable compound (D) is, for example, 1 or more and preferably 2.5 or more and 5.5 or less from the viewpoint of the developability of the resin layer.

The surface tension σr of the resin layer can be decreased by introducing a fluorine atom or a siloxane bond into the resin (C).

[2-5] Photopolymerizable Compound (D)

The resin composition may contain one or more photopolymerizable compounds (D). The resin composition further containing the photopolymerizable compound (D) and the photopolymerization initiator (E) described later exhibits the curability. The photopolymerizable compound (D) is a compound that can be polymerized by an active radical, an acid, or the like generated from the photopolymerization initiator (E) described later, and examples thereof include a compound having an ethylenically unsaturated bond, and preferable is a (meth)acrylic ester compound.

In particular, the photopolymerizable compound (D) is preferably a polymerizable compound having three or more ethylenically unsaturated bonds. Examples of such a polymerizable compound include trimethylolpropane tri(meth) acrylate, pentaerythritol tri(meth)acrylate, pentaerythritol tetra(meth)acrylate, dipentaerythritol penta(meth)acrylate, dipentaerythritol hexa(meth)acrylate, tripentaerythritol octa (meth)acrylate, tripentaerythritol hepta(meth)acrylate, tetrapentaerythritol deca(meth)acrylate, tetrapentaerythritol nona (meth)acrylate, tris(2-(meth)acryloyloxyethyl)isocyanurate, ethylene glycol-modified pentaerythritol tetra(meth)acrylate, ethylene glycol-modified dipentaerythritol hexa(meth) acrylate, propylene glycol-modified pentaerythritol tetra(meth)acrylate, propylene glycol-modified dipentaerythritol hexa(meth)acrylate, caprolactone-modified pentaerythritol tetra(meth)acrylate, caprolactone-modified dipentaerythritol hexa(meth)acrylate.

The weight-average molecular weight of the photopolymerizable compound (D) is preferably 150 or more and 2900 or less, and more preferably 250 or more and 1500 or less.

In the case where the resin composition contains the photopolymerizable compound (D), the content ratio of the photopolymerizable compound (D) in the resin composition is preferably, based on the total amount of the solid content of the resin composition, 7% by mass or more and 60% by mass or less, more preferably 10% by mass or more and 45% by mass or less, and still more preferably 13% by mass or more and 30% by mass or less. When the content ratio of the photopolymerizable compound (D) is within the above range, the residual film ratio of the cured pattern and the chemical resistance of the cured pattern tend to further improve.

[2-6] Photopolymerization Initiator (E)

In the case where the resin composition contains the photopolymerizable compound (D), usually, the resin composition further contains one or more photopolymerization initiators (E). The photopolymerization initiator (E) is a compound capable of initiating polymerization by generating active radicals, acids and the like by the action of light and heat.

The photopolymerization initiator (E) preferably contains an oxime compound having a first molecular structure represented by the following formula (1). Hereinafter, the oxime compound is also referred to as "oxime compound (1)".

[Formula 5]

(1)

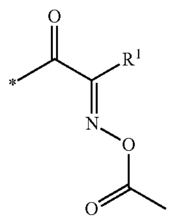

Containing the oxime compound (1) as the photopolymerization initiator (E) can be advantageous from the viewpoint of increasing the outgoing light intensity of the resin layer (wavelength conversion film or the like). One of the reasons why the resin composition can exhibit such an effect is presumed to be that the oxime compound (1) has a high ability to initiate photoradical polymerization, because the absorption wavelength of the oxime compound (1) changes greatly before and after cleavage (decomposition) of the oxime compound (1), which is necessary when the oxime compound (1) initiates photopolymerization, due to the unique molecular structure of the oxime compound (1).

In the formula (1), $R^1$ represents $R^{11}$, $OR^{11}$, $COR^{11}$, $SR^{11}$, $CONR^{12}R^{13}$, or CN.

$R^{11}$, $R^{12}$, and $R^{13}$ each independently represent a hydrogen atom, an alkyl group having 1 to 20 carbon atoms, an aryl group having 6 to 30 carbon atoms, an aralkyl group having 7 to 30 carbon atoms, or a heterocyclic group having 2 to 20 carbon atoms.

The hydrogen atoms of the group represented by $R^{11}$, $R^{12}$, or $R^{13}$ are optionally replaced by $OR^{21}$, $COR^{21}$, $SR^{21}$, $NR^{22}Ra^{23}$, $CONR^{22}R^{23}$, $—NR^{22}—OR^{23}$, $—N(COR^{22})—COOR^{23}$, $—C(=N—OR^{21})—R^{22}$, $—C(=N—OCOR^{21})—R^{22}$, CN, a halogen atom, or $COOR^{21}$.

$R^{21}$, $R^{22}$, and $R^{23}$ each independently represent a hydrogen atom, an alkyl group having 1 to 20 carbon atoms, an aryl group having 6 to 30 carbon atoms, an aralkyl group having 7 to 30 carbon atoms, or a heterocyclic group having 2 to 20 carbon atoms.

The hydrogen atoms of the group represented by $R^{21}$, $R^{22}$, or $R^{23}$ are optionally replaced by CN, a halogen atom, a hydroxy group, or a carboxy group.

When the group represented by $R^{11}$, $R^{12}$, $R^{13}$, $R^{21}$, $R^{22}$, or $R^{23}$ has an alkylene moiety, the alkylene moiety is optionally interrupted one to five times by —O—, —S—, —COO—, —OCO—, $—NR^{24}—$, $—NR^{24}CO—$, $—NR^{24}COO—$, $—OCONR^{24}—$, —SCO—, —COS—, —OCS—, or —CSO—.

$R^{24}$ represents a hydrogen atom, an alkyl group having 1 to 20 carbon atoms, an aryl group having 6 to 30 carbon atoms, an aralkyl group having 7 to 30 carbon atoms, or a heterocyclic group having 2 to 20 carbon atoms.

When the group represented by $R^{11}$, $R^{12}$, $R^{13}$, $R^{21}$, $R^{22}$, or $R^{23}$ has an alkyl moiety, the alkyl moiety is optionally branched or cyclic, and $R^{12}$ and $R^{13}$, and $R^{22}$ and $R^{23}$ are each optionally joined together to form a ring.

* represents a bond with a second molecular structure which is a molecular structure other than the first molecular structure of the oxime compound (1).

Examples of alkyl groups having 1 to 20 carbon atoms represented by $R^{11}$, $R^{12}$, $R^{13}$, $R^{21}$, $R^{22}$, $R^{23}$, and $R^{24}$ in the formula (1) include a methyl group, an ethyl group, a propyl group, an isopropyl group, a butyl group, an isobutyl group, a sec-butyl group, a tert-butyl group, a pentyl group, an isopentyl group, a tert-pentyl group, a hexyl group, a heptyl group, an octyl group, an isooctyl group, a 2-ethylhexyl group, a tert-octyl group, a nonyl group, an isononyl group, a decyl group, an isodecyl group, an undecyl group, a dodecyl group, a tetradecyl group, a hexadecyl group, an octadecyl group, an icosyl group, a cyclopentyl group, a cyclohexyl group, a cyclohexylmethyl group, and a cyclohexylethyl group.

Examples of aryl groups having 6 to 30 carbon atoms represented by $R^{11}$, $R^{12}$, $R^{13}$, $R^{21}$, $R^{22}$, $R^{23}$, and $R^{24}$ in the formula (1) include a phenyl group, a tolyl group, a xylyl group, an ethylphenyl group, a naphthyl group, an anthryl group, a phenanthryl group; and a phenyl group, a biphenylyl group, a naphthyl group, and an anthryl group substituted with one or more of the alkyl groups.

Examples of aralkyl groups having 7 to 30 carbon atoms represented by $R^{11}$, $R^{12}$, $R^{13}$, $R^{21}$, $R^{22}$, $R^{23}$, and $R^{24}$ in the formula (1) include a benzyl group, an α-methylbenzyl group, an α,α-dimethylbenzyl group, and a phenylethyl group.

Examples of the heterocyclic groups having 2 to 20 carbon atoms represented by $R^{11}$, $R^{12}$, $R^{13}$, $R^{21}$, $R^{22}$, $R^{23}$, and $R^{24}$ in the formula (1) include a pyridyl group, a pyrimidyl group, a furyl group, a thienyl group, a tetrahydrofuryl group, a dioxolanyl group, a benzoxazol-2-yl group, a tetrahydropyranyl group, a pyrrolidyl group, an imidazolidyl group, a pyrazolidyl group, a thiazolidyl group, an isothiazolidyl group, an oxazolidyl group, an isoxazolidyl group, a piperidyl group, a piperazyl group, and a morpholinyl group, and preferable is a 5- to 7-membered heterocyclic group.

$R^{12}$ and $R^{13}$ and $R^{22}$ and $R^{23}$ in the formula (1) are each optionally joined together to form a ring, meaning that $R^{12}$ and $R^{13}$ and $R^{22}$ and $R^{23}$ are each optionally joined together to form a ring together with a nitrogen atom, a carbon atom, or an oxygen atom to be connected.

Examples of the ring that can be formed by joining $R^{12}$ and $R^{13}$ and $R^{22}$ and $R^{23}$ in the formula (1) together include a cyclopentane ring, a cyclohexane ring, a cyclopentene ring, a benzene ring, a piperidine ring, a morpholine ring, a lactone ring, and a lactam ring, and preferable is a 5- to 7-membered ring.

Examples of the halogen atom that $R^{11}$, $R^{12}$, $R^{13}$, $R^{21}$, $R^{22}$, and $R^{23}$ in the formula (1) may have as a substituent include a fluorine atom, a chlorine atom, a bromine atom and an iodine atom.

$R^1$ in the formula (1) is preferably $R^{11}$, more preferably an alkyl group having 1 to 20 carbon atoms, still more preferably an alkyl group having 1 to 10 carbon atoms, and yet still more preferably an alkyl group having 1 to 6.

An example of the second molecular structure linked to the first molecular structure represented by the formula (1) is a structure represented by the following formula (2). The second molecular structure refers to a molecular structure portion of the oxime compound (1) other than the first molecular structure.

The bond represented by "*" in the formula (2) is directly bonded to the bond represented by "*" in the formula (1). That is, when the second molecular structure is a structure represented by the formula (2), the benzene ring having "—*" in the formula (2) and the carbonyl group having "—*" in the formula (1) are directly bonded to each other.

[Formula 6]

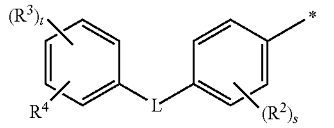

(2)

In the formula (2), $R^2$ and $R^3$ each independently represent $R^{11}$, $OR^{11}$, $SR^{11}$, $COR^{11}$, $CONR^{22}R^{23}$, $NR^{22}COR^{11}$, $OCOR^{11}$, $COOR^{11}$, $SCOR^{11}$, $OCSR^{11}$, $COSR^{11}$, $CSOR^{11}$, CN, or a halogen atom.

A plurality of $R^2$, when present, are optionally the same or different.

A plurality of $R^3$, when present, are optionally the same or different.

$R^{11}$, $R^{12}$, and $R^{23}$ have the same meaning as described above.

s and t each independently represent an integer of 0 to 4.

L represents a sulfur atom, $CR^{31}R^{32}$, CO, or $NR^{33}$.

$R^{31}$, $R^{32}$, and $R^{33}$ each independently represent a hydrogen atom, an alkyl group having 1 to 20 carbon atoms, an aryl group having 6 to 30 carbon atoms, or an aralkyl group having 7 to 30 carbon atoms.

When the group represented by $R^{31}$, $R^{32}$, or $R^{33}$ has an alkyl moiety, the alkyl moiety is optionally branched or cyclic, and $R^{31}$, $R^{32}$, and $R^{33}$ are each independently and optionally joined together to form a ring with any of adjacent benzene rings.

$R^4$ represents a hydroxy group, a carboxy group, or a group represented by the following formula (2-1):

[Formula 7]

$$(R^{4a})_v\text{-}L^2\text{-}L^1\text{-} \quad (2\text{-}1)$$

(In the formula (2-1), $L^1$ represents —O—, —S—, —$NR^{22}$—, —$NR^{22}CO$—, —$SO_2$—, —CS—, —OCO—, or —COO—.

$R^{22}$ has the same meaning as described above.

$L^2$ represents a group obtained by removing v hydrogen atoms from an alkyl group having 1 to 20 carbon atoms, a group obtained by removing v hydrogen atoms from an aryl group having 6 to 30 carbon atoms, a group obtained by removing v hydrogen atoms from an aralkyl group having 7 to 30 carbon atoms, or a group obtained by removing v hydrogen atoms from a heterocyclic group having 2 to 20 carbon atoms.

When the group represented by $L^2$ has an alkylene moiety, the alkylene moiety is optionally interrupted one to five times by —O—, —S—, —COO—, —OCO—, —$NR^{22}$—, —$NR^{22}COO$—, —$OCONR^{22}$—, —SCO—, —COS—, —OCS—, or —CSO—, and the alkylene moiety is optionally branched or cyclic.

$R^{4a}$ is each independently $OR^{41}$, $SR^{41}$, $CONR^{42}R^{43}$, $NR^{42}COR^{43}$, $OCOR^{41}$, $COOR^{41}$, $SCOR^{41}$, $OCSR^{41}$, $COSR^{41}$, $CSOR^{41}$, CN, or a halogen atom.

A plurality of $R^{4a}$, when present, are optionally the same or different.

$R^{41}$, $R^{42}$, and $R^{43}$ each independently represent a hydrogen atom, an alkyl group having 1 to 20 carbon atoms, an aryl group having 6 to 30 carbon atoms, or an aralkyl group having 7 to 30 carbon atoms, and when the group represented by $R^{41}$, $R^{42}$, and $R^{43}$ has an alkyl moiety, the alkyl moiety is optionally branched or cyclic, and $R^{42}$ and $R^{43}$ are optionally joined together to form a ring.

v represents an integer of 1 to 3.)

* represents a bond with the first molecular structure of the oxime compound (1).

Examples of alkyl groups having 1 to 20 carbon atoms, aryl groups having 6 to 30 carbon atoms, and aralkyl groups having 7 to 30 carbon atoms represented by $R^{11}$, $R^{12}$, $R^{13}$, $R^{21}$, $R^{22}$, $R^{23}$, $R^{24}$, $R^{31}$, $R^{32}$, and $R^{33}$ in the formula (2) and $R^{22}$, $R^{41}$, $R^{42}$, and $R^{43}$ in the formula (2-1) are the same as examples for $R^{11}$, $R^{12}$, $R^{13}$, $R^{21}$, $R^{22}$, $R^{23}$, and $R^{24}$ in the formula (1).

Examples of heterocyclic groups having 2 to 20 carbon atoms represented by $R^{11}$, $R^{12}$, $R^{13}$, $R^{21}$, $R^{22}$, $R^{23}$, and $R^{24}$ in the formula (2) and $R^{22}$ in the formula (2-1) are the same as examples for $R^{11}$, $R^{12}$, $R^{13}$, $R^{21}$, $R^{22}$, $R^{23}$, and $R^{24}$ in the formula (1).

$R^{31}$, $R^{32}$, and $R^{33}$ in the formula (2) are each independently and optionally joined together to form a ring with any of adjacent benzene rings, meaning that $R^{31}$, $R^{32}$, and $R^{33}$ are each independently and optionally joined together to form a ring with any of adjacent benzene rings together with a nitrogen atom to be connected.

Examples of the ring which can be formed by joining $R^{31}$, $R^{32}$, and $R^{33}$ in the formula (2) together with any of adjacent benzene rings are the same as those of the ring which can be formed by joining $Ra^{12}$ and $Ra^{13}$ and $Ra^{22}$ and $Ra^{23}$ in the formula (1) together.

$L^2$ in the above formula (2-1) represents groups obtained by removing v hydrogen atoms from an alkyl group having 1 to 20 carbon atoms, an aryl group having 6 to 30 carbon atoms, an aralkyl group having 7 to 30 carbon atoms, or a heterocyclic group having 2 to 20 carbon atoms.

Examples of the group obtained by removing v hydrogen atoms from an alkyl group having 1 to 20 carbon atoms when v is 1 include alkylene groups such as a methylene group, an ethylene group, a propylene group, a methylethylene group, a butylene group, a 1-methylpropylene group, a 2-methylpropylene group, a 1,2-dimethylpropylene group, a 1,3-dimethylpropylene group, a 1-methylbutylene group, a 2-methylbutylene group, a 3-methylbutylene group, a 4-methylbutylene group, a 2,4-dimethylbutylene group, a 1,3-dimethylbutylene group, a pentylene group, a hexylene group, a heptylene group, an octylene group, a nonylene group, a decylene group, a dodecylene group, a tridecylene group, a tetradecylene group, a pentadecylene group, an ethane-1,1-diyl group, and a propane-2,2-diyl group.

Examples of the group obtained by removing v hydrogen atoms from an aryl group having 6 to 30 carbon atoms when v is 1 include arylene groups such as a 1,2-phenylene group, 1,3-phenylene group, and a 1,4-phenylene group, a 2,6-naphthylene group, a 1,4-naphthylene group, a 2,5-dimethyl-1,4-phenylene group, a diphenylmethane-4,4'-diyl group, a 2,2-diphenylpropane-4,4'-diyl group, a diphenylsulfide-4,4'-diyl group, and a diphenylsulfon-4,4'-diyl group.

Examples of the group obtained by removing v hydrogen atoms from an aralkyl group having 7 to 30 carbon atoms when v is 1 include a group represented by the following formula (a) and a group represented by the following formula (b).

[Formula 8]

(a)

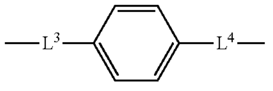

(b)

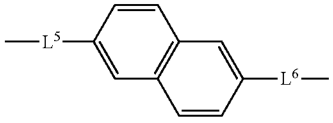

[In the formulas (a) and (b), $L^3$ and $L^5$ represent an alkylene group having 1 to 10 carbon atoms, and $L^4$ and $L^6$ represent a single bond or an alkylene group having 1 to 10 carbon atoms.]

Examples of the alkylene group having 1 to 10 carbon atoms include alkylene groups such as a methylene group, an ethylene group, a propylene group, a methylethylene group, a butylene group, a 1-methylpropylene group, a 2-methylpropylene group, a 1,2-dimethylpropylene group, a 1,3-dimethylpropylene group, a 1-methylbutylene group, a 2-methylbutylene group, a 3-methylbutylene group, a 4-methylbutylene group, a 2,4-dimethylbutylene group, a 1,3-dimethylbutylene group, a pentylene group, a hexylene group, a heptylene group, an octylene group, a nonylene group, and a decylene group.

Examples of the group obtained by removing v hydrogen atoms from a heterocyclic group having 2 to 20 carbon atoms when v is 1 include divalent heterocyclic groups such as a 2,5-pyridinediyl group, a 2,6-pyridinediyl group, a 2,5-pyrimidinediyl group, a 2,5-thiophenediyl group, a 3,4-tetrahydrofurandiyl group, a 2,5-tetrahydrofurandiyl group, a 2,5-furandiyl group, a 3,4-thiazolediyl group, a 2,5-benzofurandiyl group, a 2,5-benzothiophenediyl group, an N-methylindole-2,5-diyl group, a 2,5-benzothiazolediyl group, and a 2,5-benzoxazolediyl group.

Examples of the halogen atom represented by $R^2$ and $R^3$ in the formula (2) and $R^{4a}$ in the formula (2-1) include a fluorine atom, a chlorine atom, a bromine atom and an iodine atom.

From the viewpoint of solubility in the solvent (F) and/or the development speed of the resin composition, a preferable example of the structure represented by the formula (2) is the structure represented by the following formula (2a):

[Formula 9]

(2a)

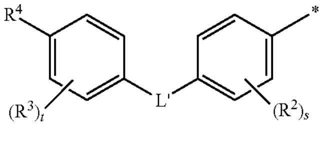

[In the formula (2a), L' represents a sulfur atom or $NR^{50}$, $R^{50}$ represents a linear, branched, or cyclic alkyl group having 1 to 20 carbon atoms, and $R^2$, $R^3$, $R^4$, s, and t have the same meaning as described above.]

From the same viewpoint as above, another preferable example of the structure represented by the formula (2) is the structure represented by the following formula (2b):

[Formula 10]

(2b)

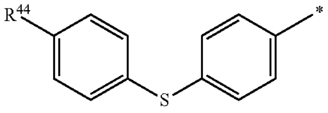

[In the formula (2b), $R^{44}$ represents a hydroxy group, a carboxy group, or a group represented by the following formula (2-2):

[Formula 11]

$$R^{44a}\text{-}L^{12}\text{-}L^{11}\text{-} \quad (2\text{-}2)$$

(In the formula (2-2), $L^{11}$ represents —O— or *—OCO—, * represents a bond to $L^{12}$, $L^{12}$ represents an alkylene group having 1 to 20 carbon atoms, the alkylene group may be interrupted by one to three —O—, $R^{44a}$ represents $OR^{55}$ or $COOR^{55}$, $R^{55}$ represents a hydrogen atom or an alkyl group having 1 to 6 carbon atoms).]

$R^{44}$ is preferably a group represented by the formula (2-2). In this case, it is advantageous in terms of the solubility of the oxime compound (1) in the solvent (F) and the development speed of the resin composition.

The number of carbon atoms of the alkylene group represented by $L^{12}$ is preferably 1 to 10, and more preferably 1 to 4.

$R^{44a}$ is preferably a hydroxy group or a carboxy group, and more preferably a hydroxy group.

The method for producing the oxime compound (1) having the second molecular structure represented by the formula (2) is not particularly limited, but the oxime compound (1) can be produced by the method disclosed in Japanese Patent Laid-Open No. 2011-132215.

Another example of the second molecular structure linked to the first molecular structure represented by the formula (1) is a structure represented by the following formula (3).

The bond represented by "*" in the formula (3) is directly bonded to the bond represented by "*" in the formula (1). That is, when the second molecular structure is a structure represented by the formula (3), the benzene ring having "—*" in the formula (3) and the carbonyl group having "—*" in the formula (1) are directly bonded to each other.

[Formula 12]

(3)

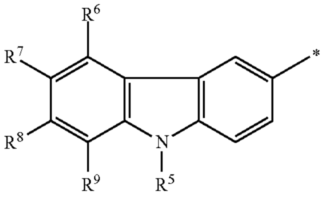

In the formula (3), $R^5$ represents a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms.

When the group represented by $R^5$ has an alkyl moiety, the alkyl moiety is optionally branched or cyclic.

The hydrogen atoms of the group represented by $R^5$ are optionally replaced by $R^{21}$, $OR^{21}$, $COR^{21}$, $SR^{21}$, $NR^{22}R^{23}$, CONNR$^{22}$R$^{23}$, —NR$^{22}$—OR$^{23}$, —N(COR$^{22}$)—OCOR$^{23}$, NR$^{22}$COR$^{21}$, OCOR$^{21}$, COOR$^{21}$, —C(=N—OR$^{21}$)—R$^{22}$, —C(=N—OCOR$^{21}$)—R$^{22}$, SCOR$^{21}$, OCSR$^{21}$, COSR$^{21}$, CSOR$^{21}$, a hydroxyl group, a nitro group, CN, a halogen atom, or COOR$^{21}$.

R$^{21}$, R$^{22}$, and R$^{23}$ have the same meaning as described above.

The hydrogen atoms of the group represented by R$^{21}$, R$^{22}$, or R$^{23}$ are optionally replaced by CN, a halogen atom, a hydroxy group, or a carboxy group.

When the group represented by R$^{21}$, R$^{22}$, and R$^{23}$ has an alkylene moiety, the alkylene moiety is optionally interrupted one to five times by —O—, —S—, —COO—, —OCO—, —NR$^{24}$—, —NR$^{24}$CO—, —NR$^{24}$COO—, —OCONR$^{24}$—, —SCO—, —COS—, —OCS—, or —CSO—.

R$^{24}$ has the same meaning as described above.

When the group represented by R$^{21}$, R$^{22}$, and R$^{23}$ has an alkyl moiety, the alkyl moiety is optionally branched or cyclic, and R$^{22}$ and R$^{23}$ are optionally joined together to form a ring.

R$^{6}$, R$^{7}$, R$^{8}$, and R$^{9}$ are each independently R$^{61}$, OR$^{61}$, SR$^{61}$, COR$^{62}$, CONR$^{63}$R$^{64}$, NR$^{65}$COR$^{61}$, OCOR$^{61}$, COOR$^{62}$, SCOR$^{61}$, OCSR$^{61}$, COSR$^{62}$, CSOR$^{61}$, a hydroxy group, a nitro group, CN, or a halogen atom.

R$^{61}$, R$^{62}$, R$^{63}$, R$^{64}$, and R$^{65}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms.

The hydrogen atoms of the group represented by R$^{61}$, R$^{62}$, R$^{63}$, R$^{64}$, or R$^{65}$ are optionally replaced by OR$^{21}$, COR$^{21}$, SR$^{21}$, NR$^{22}$Ra$^{23}$, CONR$^{22}$R$^{23}$, —NR$^{22}$—OR$^{23}$, —N(COR$^{22}$)—OCOR$^{23}$, —C(=N—OR$^{21}$)—R$^{22}$, —C(=N—OCOR$^{21}$)—R$^{22}$, CN, a halogen atom, or COOR$^{21}$.

R$^{6}$ and R$^{7}$, R$^{7}$ and R$^{8}$, and R$^{8}$ and R$^{9}$ are each optionally joined together to form a ring.

* represents a bond with the first molecular structure of the oxime compound (1).

Examples of alkyl groups having 1 to 20 carbon atoms, aryl groups having 6 to 30 carbon atoms, aralkyl groups having 7 to 30 carbon atoms, and heterocyclic groups having 2 to 20 carbon atoms represented by R$^{5}$, R$^{21}$, R$^{22}$, R$^{23}$, R$^{24}$, R$^{61}$, R$^{62}$, R$^{63}$, R$^{64}$, and R$^{65}$ in the formula (3) are the same as examples for R$^{11}$, R$^{12}$, R$^{13}$, R$^{21}$, R$^{22}$, R$^{23}$, and R$^{24}$ in the formula (1).

R$^{22}$ and R$^{23}$ in the formula (3) are each optionally joined together to form a ring, meaning that R$^{22}$ and R$^{23}$ are each optionally joined together to form a ring together with a nitrogen atom, a carbon atom, or an oxygen atom to be connected.

Examples of the ring which can be formed by joining R$^{22}$ and R$^{23}$ in the formula (3) together are the same as those of the ring which can be formed by joining Ra$^{12}$ and Ra$^{13}$, and Ra$^{22}$ and Ra$^{23}$ in the formula (1) together.

Examples of the halogen atom represented by R$^{6}$, R$^{7}$, R$^{8}$, and R$^{9}$, and the halogen atoms which may replace the hydrogen atoms of R$^{5}$, R$^{21}$, R$^{22}$, R$^{23}$, R$^{61}$, R$^{62}$, R$^{63}$, R$^{64}$, and R$^{65}$ in the formula (3) include a fluorine atom, a chlorine atom, a bromine atom and an iodine atom.

From the viewpoint of solubility in the solvent (F) and/or the development speed of the resin composition, in one preferable embodiment, R$^{5}$ is a group represented by the following formula (3-1):

[Formula 13]

(3-1)

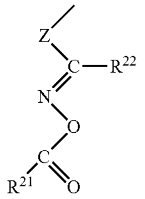

[In the formula (3-1), Z represents a group obtained by removing one hydrogen atom from an alkyl group having 1 to 20 carbon atoms, a group obtained by removing one hydrogen atom from an aryl group having 6 to 30 carbon atoms, a group obtained by removing one hydrogen atom from an aralkyl group having 7 to 30 carbon atoms, or a group obtained by removing one hydrogen atom from a heterocyclic group having 2 to 20 carbon atoms.

When the group represented by Z has an alkylene moiety, the alkylene moiety is optionally interrupted one to five times by —O—, —S—, —COO—, —COO—, —NR$^{24}$—, —NR$^{24}$COO—, —OCONR$^{24}$—, —SCO—, —COS—, —OCS—, or —CSO—, and the alkylene moiety is optionally branched or cyclic.

R$^{21}$, R$^{22}$, and R$^{24}$ have the same meaning as described above.]

From the same viewpoint as above, Z in the formula (3-1) is preferably a methylene group, an ethylene or phenylene group.

From the same viewpoint as above, R$^{21}$ and R$^{22}$ in the formula (3-1) are preferably an alkyl group having 1 to 20 carbon atoms or an aryl group having 6 to 30 carbon atoms, and more preferably a methyl group, an ethyl group, or a phenyl group.

From the same viewpoint as above, in another preferred embodiment, R$^{7}$ is a nitro group.

The method for producing the oxime compound (1) having the second molecular structure represented by the formula (3) is not particularly limited, but the oxime compound (1) can be produced by the method disclosed in Japanese Patent Laid-Open No. 2000-80068 and Japanese Patent Laid-Open No. 2011-178776.

Yet another example of the second molecular structure linked to the first molecular structure represented by the formula (1) is a structure represented by the following formula (4).

The bond represented by "*" in the formula (4) is directly bonded to the bond represented by "*" in the formula (1). That is, when the second molecular structure is a structure represented by the formula (4), the benzene ring having "—*" in the formula (4) and the carbonyl group having "—*" in the formula (1) are directly bonded to each other.

[Formula 14]

(4)

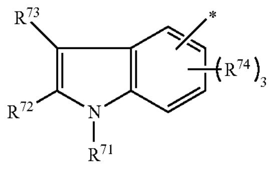

In the formula (4), $R^{71}$ represents a hydrogen atom, an alkyl group having 1 to 20 carbon atoms, an aryl group having 6 to 30 carbon atoms, an aralkyl group having 7 to 30 carbon atoms, or a heterocyclic group having 2 to 20 carbon atoms.

When the group represented by $R^{71}$ has an alkyl moiety, the alkyl moiety is optionally branched or cyclic.

The hydrogen atoms of the group represented by $R^{71}$ are optionally replaced by $R^{21}$, $OR^{21}$, $COR^{21}$, $SR^{21}$, $NR^{22}R^{23}$, $CONR^{22}R^{23}$, $—NR^{22}—OR^{23}$, $—N(COR^{22})—OCOR^{23}$, $NR^{22}COR^{21}$, $OCOR^{21}$, $COOR^{21}$, $—C(=N—OR^{21})—R^{22}$, $—C(=N—OCOR^{21})—R^{22}$, $SCOR^{21}$, $OCSR^{21}$, $COSR^{21}$, $CSOR^{21}$, a hydroxyl group, a nitro group, CN, a halogen atom, or $COOR^{21}$.

$R^{21}$, $R^{22}$, and $R^{23}$ have the same meaning as described above.

The hydrogen atoms of the group represented by $R^{21}$, $R^{22}$, or $R^{23}$ are optionally replaced by CN, a halogen atom, a hydroxy group, or a carboxy group.

When the group represented by $R^{21}$, $R^{22}$, and $R^{23}$ has an alkylene moiety, the alkylene moiety is optionally interrupted one to five times by —O—, —S—, —COO—, —OCO—, $—NR^{24}—$, $—NR^{24}CO—$, $—NR^{24}COO—$, $—OCONR^{24}—$, —SCO—, —COS—, —OCS—, or —CSO—.

$R^{24}$ has the same meaning as described above.

When the group represented by $R^{21}$, $R^{22}$, and $R^{23}$ has an alkyl moiety, the alkyl moiety is optionally branched or cyclic, and $R^{22}$ and $R^{23}$ are optionally joined together to form a ring.

$R^{72}$, $R^{73}$, and three $R^{74}$ each independently represent $R^{61}$, $OR^{61}$, $SR^{61}$, $COR^{62}$, $CONR^{63}R^{64}$, $NR^{65}COR^{61}$, $OCOR^{61}$, $COOR^{62}$, $SCOR^{61}$, $OCSR^{61}$, $COSR^{62}$, $CSOR^{61}$, a hydroxy group, a nitro group, CN, or a halogen atom.

$R^{61}$, $R^{62}$, $R^{63}$, $R^{64}$, and $R^{65}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms.

The hydrogen atoms of the group represented by $R^{61}$, $R^{62}$, $R^{63}$, $R^{64}$, or $R^{65}$ are optionally replaced by $OR^{21}$, $COR^{21}$, $SR^{21}$, $NR^{22}Ra^{23}$, $CONR^{22}R^{23}$, $—NR^{22}—OR^{23}$, $—N(COR^{22})—OCOR^{23}$, $—C(=N—OR^{21})—R^{22}$, $—C(=N—OCOR^{21})—R^{22}$, CN, a halogen atom, or $COOR^{21}$.

$R^{72}$ and $R^{73}$ and two $R^{74}$ are each optionally joined together to form a ring.

* represents a bond with the first molecular structure of the oxime compound (1).

Examples of alkyl groups having 1 to 20 carbon atoms, aryl groups having 6 to 30 carbon atoms, aralkyl groups having 7 to 30 carbon atoms, and heterocyclic groups having 2 to 20 carbon atoms represented by $R^{71}$, $R^{21}$, $R^{22}$, $R^{23}$, $R^{24}$, $R^{61}$, $R^{62}$, $R^{63}$, $R^{64}$, and $R^{65}$ in the formula (4) are the same as examples for $R^{11}$, $R^{12}$, $R^{13}$, $R^{21}$, $R^{22}$, $R^{23}$, and $R^{24}$ in the formula (1).

$R^{22}$ and $R^{23}$ in the formula (4) are each optionally joined together to form a ring, meaning that $R^{22}$ and $R^{23}$ are each optionally joined together to form a ring together with a nitrogen atom, a carbon atom, or an oxygen atom to be connected.

Examples of the ring which can be formed by joining $R^{22}$ and $R^{23}$ in the formula (4) together are the same as those of the ring which can be formed by joining $Ra^{12}$ and $Ra^{13}$, and $Ra^{22}$ and $Ra^{23}$ in the formula (1) together.

Examples of the halogen atom represented by $R^{72}$, $R^{73}$, and $R^{74}$, and the halogen atoms which may replace the hydrogen atoms of $R^{71}$, $R^{21}$, $R^{22}$, $R^{23}$, $R^{61}$, $R^{62}$, $R^{63}$, $R^{64}$, and $R^{65}$ in the formula (4) include a fluorine atom, a chlorine atom, a bromine atom and an iodine atom.

The method for producing the oxime compound (1) having the second molecular structure represented by the formula (4) is not particularly limited, but the oxime compound (1) can be produced by the method disclosed in International Publication No. 2017/051680 and International Publication No. 2020/004601.

Yet another example of the second molecular structure linked to the first molecular structure represented by the formula (1) is a structure represented by the following formula (5).

The bond represented by "*" in the formula (5) is directly bonded to the bond represented by "*" in the formula (1). That is, when the second molecular structure is a structure represented by the formula (5), the pyrrole ring having "—*" in the formula (5) and the carbonyl group having "—*" in the formula (1) are directly bonded to each other.

[Formula 15]

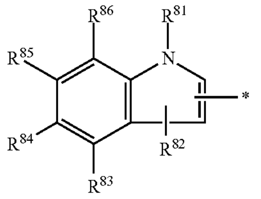

(5)

In the formula (5), $R^{81}$ represents a hydrogen atom, an alkyl group having 1 to 20 carbon atoms, an aryl group having 6 to 30 carbon atoms, an aralkyl group having 7 to 30 carbon atoms, or a heterocyclic group having 2 to 20 carbon atoms.

When the group represented by $R^{81}$ has an alkyl moiety, the alkyl moiety is optionally branched or cyclic.

The hydrogen atoms of the group represented by $R^{81}$ are optionally replaced by $R^{21}$, $OR^{21}$, $COR^{21}$, $SR^{21}$, $NR^{22}R^{23}$, $CONR^{22}R^{23}$, $—NR^{22}—OR^{23}$, $—N(COR^{22})—OCOR^{23}$, $NR^{22}COR^{21}$, $OCOR^{21}$, $COOR^{21}$, $—C(=N—OR^{21})—R^{22}$, $—C(=N—OCOR^{21})—R^{22}$, $SCOR^{21}$, $OCSR^{21}$, $COSR^{21}$, $CSOR^{21}$, a hydroxyl group, a nitro group, CN, a halogen atom, or $COOR^{21}$.

$R^{21}$, $R^{22}$, and $R^{23}$ have the same meaning as described above.

The hydrogen atoms of the group represented by $R^{21}$, $R^{22}$, or $R^{23}$ are optionally replaced by CN, a halogen atom, a hydroxy group, or a carboxy group.

When the group represented by $R^{21}$, $R^{22}$, and $R^{23}$ has an alkylene moiety, the alkylene moiety is optionally interrupted one to five times by —O—, —S—, —COO—, —OCO—, $—NR^{24}—$, $—NR^{24}CO—$, $—NR^{24}COO—$, $—OCONR^{24}—$, —SCO—, —COS—, —OCS—, or —CSO—.

$R^{24}$ has the same meaning as described above.

When the group represented by $R^{21}$, $R^{22}$, and $R^{23}$ has an alkyl moiety, the alkyl moiety is optionally branched or cyclic, and $R^{22}$ and $R^{23}$ are optionally joined together to form a ring.

$R^{82}$, $R^{83}$, $R^{84}$, $R^{85}$, and $R^{86}$ are each independently $R^{61}$, $OR^{61}$, $SR^{61}$, $COR^{62}$, $CONR^{63}R^{64}$, $NR^{65}COR^{61}$, $OCOR^{61}$, $COOR^{62}$, $SCOR^{61}$, $OCSR^{61}$, $COSR^{62}$, $CSOR^{61}$, a hydroxy group, a nitro group, CN, or a halogen atom.

$R^{61}$, $R^{62}$, $R^{63}$, $R^{64}$, and $R^{65}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms.

The hydrogen atoms of the group represented by $R^{61}$, $R^{62}$, $R^{63}$, $R^{64}$, or $R^{65}$ are optionally replaced by $OR^{21}$, $COR^{21}$, $SR^{21}$, $NR^{22}Ra^{23}$, $CONR^{22}R^{23}$, $-NR^{22}-OR^{23}$, $-N(COR^{22})-OCOR^{23}$, $-C(=N-OR^{21})-R^{22}$, $-C(=N-OCOR^{21})-R^{22}$, CN, a halogen atom, or $COOR^{21}$.

$R^{83}$ and $R^{84}$, $R^{84}$ and $R^{85}$, and $R^{85}$ and $R^{86}$ are each optionally joined together to form a ring.

* represents a bond with the first molecular structure of the oxime compound (1).

Examples of alkyl groups having 1 to 20 carbon atoms, aryl groups having 6 to 30 carbon atoms, aralkyl groups having 7 to 30 carbon atoms, and heterocyclic groups having 2 to 20 carbon atoms represented by $R^{81}$, $R^{21}$, $R^{22}$, $R^{23}$, $R^{24}$, $R^{61}$, $R^{62}$, $R^{63}$, $R^{64}$, and $R^{65}$ in the formula (5) are the same as examples for $R^{11}$, $R^{12}$, $R^{13}$, $R^{21}$, $R^{22}$, $R^{23}$, and $R^{24}$ in the formula (1).

$R^{22}$ and $R^{23}$ in the formula (5) are each optionally joined together to form a ring, meaning that $R^{22}$ and $R^{23}$ are each optionally joined together to form a ring together with a nitrogen atom, a carbon atom, or an oxygen atom to be connected.

Examples of the ring which can be formed by joining $R^{22}$ and $R^{23}$ in the formula (5) together are the same as those of the ring which can be formed by joining $Ra^{12}$ and $Ra^{13}$, and $Ra^{22}$ and $Ra^{23}$ in the formula (1) together.

Examples of the halogen atom represented by $R^{82}$, $R^{83}$, $R^{84}$, $R^{85}$, and $R^{86}$, and the halogen atoms which may replace the hydrogen atoms of $R^{81}$, $R^{21}$, $R^{22}$, $R^{23}$, $R^{61}$, $R^{62}$, $R^{63}$, $R^{64}$, and $R^{65}$ in the formula (5) include a fluorine atom, a chlorine atom, a bromine atom and an iodine atom.

The method for producing the oxime compound (1) having the second molecular structure represented by the formula (5) is not particularly limited, but the oxime compound (1) can be produced by the method disclosed in International Publication No. 2017/051680 and International Publication No. 2020/004601.

Yet another example of the second molecular structure linked to the first molecular structure represented by the formula (1) is a structure represented by the following formula (6).

The bond represented by "*" in the formula (6) is directly bonded to the bond represented by "*" in the formula (1). That is, when the second molecular structure is a structure represented by the formula (6), the benzene ring having "—*" in the formula (6) and the carbonyl group having "—*" in the formula (1) are directly bonded to each other.

[Formula 16]

(6)

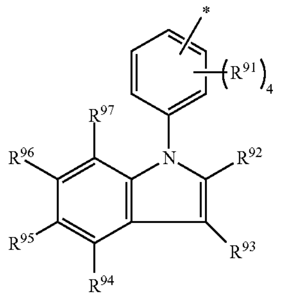

In the formula (6), four $R^{91}$, $R^{92}$, $R^{93}$, $R^{94}$, $R^{95}$, $R^{96}$, and $R^{97}$ are each independently $R^{61}$, $OR^{61}$, $SR^{61}$, $COR^{62}$, $CONR^{63}R^{64}$, $NR^{65}COR^{61}$, $OCOR^{61}$, $COOR^{62}$, $SCOR^{61}$, $OCSR^{61}$, $COSR^{62}$, $CSOR^{61}$, a hydroxy group, a nitro group, CN, or a halogen atom.

$R^{61}$, $R^{62}$, $R^{63}$, $R^{64}$, and $R^{65}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms.

The hydrogen atoms of the group represented by $R^{61}$, $R^{62}$, $R^{63}$, $R^{64}$, or $R^{65}$ are optionally replaced by $OR^{21}$, $COR^{21}$, $SR^{21}$, $NR^{22}Ra^{23}$, $CONR^{22}R^{23}$, $-NR^{22}-OR^{23}$, $-N(COR^{22})-OCOR^{23}$, $-C(=N-OR^{21})-R^{22}$, $-C(=N-OCOR^{21})-R^{22}$, CN, a halogen atom, or $COOR^{21}$.

$R^{21}$, $R^{22}$, and $R^{23}$ have the same meaning as described above.

$R^{92}$ and $R^{93}$, $R^{94}$ and $R^{95}$, $R^{95}$ and $R^{96}$, and $R^{96}$ and $R^{97}$ are each optionally joined together to form a ring.

* represents a bond with the first molecular structure of the oxime compound (1).

Examples of alkyl groups having 1 to 20 carbon atoms, aryl groups having 6 to 30 carbon atoms, aralkyl groups having 7 to 30 carbon atoms, and heterocyclic groups having 2 to 20 carbon atoms represented by $R^{21}$, $R^{22}$, $R^{23}$, $R^{61}$, $R^{62}$, $R^{63}$, $R^{64}$, and $R^{65}$ in the formula (6) are the same as examples for $R^{11}$, $R^{12}$, $R^{13}$, $R^{21}$, $R^{22}$, and $R^{23}$ in the formula (1).

$R^{22}$ and $R^{23}$ in the formula (6) are each optionally joined together to form a ring, meaning that $R^{22}$ and $R^{23}$ are each optionally joined together to form a ring together with a nitrogen atom, a carbon atom, or an oxygen atom to be connected.

Examples of the ring which can be formed by joining $R^{22}$ and $R^{23}$ in the formula (6) together are the same as those of the ring which can be formed by joining $Ra^{12}$, and $Ra^{13}$ and $Ra^{22}$ and $Ra^{23}$ in the formula (1) together.

Examples of the halogen atom represented by $R^{91}$, $R^{92}$, $R^{93}$, $R^{94}$, $R^{95}$, $R^{96}$, and $R^{97}$, and the halogen atoms which may replace the hydrogen atoms of $R^{21}$, $R^{22}$, $R^{23}$, $R^{61}$, $R^{62}$, $R^{63}$, $R^{64}$, and $R^{65}$ in the formula (6) include a fluorine atom, a chlorine atom, a bromine atom and an iodine atom.

The method for producing the oxime compound (1) having the second molecular structure represented by the formula (6) is not particularly limited, but the oxime compound (1) can be produced by the method disclosed in International Publication No. 2017/051680 and International Publication No. 2020/004601.

The photopolymerization initiator (E) preferably contains the oxime compound (1). However, the photopolymerization initiator (E) may further contain a different photopolymerization initiator other than the oxime compound (1) or may contain only a different photopolymerization initiator other than the oxime compound (1) without containing the oxime compound (1).

Examples of the other photopolymerization initiator include oxime compounds other than the oxime compound (1), biimidazole compounds, triazine compounds and acylphosphine compounds.

Examples of the oxime compound other than the oxime compound (1) include an oxime compound having a partial structure represented by the following formula (d1). * represents a bond.

[Formula 17]

(d1)

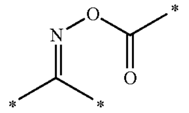

Examples of the oxime compound having a partial structure represented by the formula (d1) include N-benzoyloxy-1-(4-phenylsulfanylphenyl)butan-1-one-2-imine, N-benzoyloxy-1-(4-phenylsulfanylphenyl)octan-1-one-2-imine, N-benzoyloxy-1-(4-phenylsulfanylphenyl)-3-cyclopentylpropan-1-one-2-imine, N-acetoxy-1-[9-ethyl-6-(2-methylbenzoyl)-9H-carbazole-3-yl]ethane-1-imine, N-acetoxy-1-[9-ethyl-6-{2-methyl-4-(3,3-dimethyl-2,4-dioxacyclopentanylmethyloxy)benzoyl}-9H-carbazole yl]ethane-1-imine, N-acetoxy-1-[9-ethyl-6-(2-methylbenzoyl)-9H-carbazole-3-yl]-3-cyclopentylpropane-1-imine, and N-benzoyloxy-1-[9-ethyl-6-(2-methylbenzoyl)-9H-carbazole-3-yl]-3-cyclopentylpropan-1-one-2-imine, and compounds disclosed in Japanese Patent Laid-Open No. 2011-132215, International Publication No. 2008/78678, International Publication No. 2008/78686, and International Publication No. 2012/132558. Commercially available products such as Irgacure OXE01 and Irgacure OXE02 (all manufactured by BASF Japan Ltd.), and N-1919 (manufactured by ADEKA Corporation) may also be used.

Of these, the oxime compound having a partial structure represented by the formula (d1) is preferably at least one selected from the group consisting of N-benzoyloxy-1-(4-phenylsulfanylphenyl)butan-1-one-2-imine, N-benzoyloxy-1-(4-phenylsulfanylphenyl)octan-1-one-2-imine, and N-benzoyloxy-1-(4-phenylsulfanylphenyl)-3-cyclopentylpropan-1-one-2-imine, and more preferably N-benzoyloxy-1-(4-phenylsulfanylphenyl)octan-1-one-2-imine.

Examples of the biimidazole compound include a compound represented by the formula (d5):

[Formula 18]

(d5)

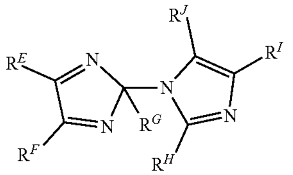

[In the formula (d5), $R^E$ to $R^J$ represent an aryl group having 6 to 10 carbon atoms which may have a substituent.]

Examples of the aryl group having 6 to 10 carbon atoms include a phenyl group, a toluyl group, a xylyl group, an ethylphenyl group, and a naphthyl group, and preferable is a phenyl group.

Examples of the substituent include a halogen atom and an alkoxy group having 1 to 4 carbon atoms. Examples of the halogen atom include a fluorine atom, a chlorine atom, a bromine atom and an iodine atom, and preferable is a chlorine atom. Examples of the alkoxy group having 1 to 4 carbon atoms include a methoxy group, an ethoxy group, a propoxy group, and a butoxy group, and preferable is a methoxy group.

Examples of the biimidazole compound include 2,2'-bis(2-chlorophenyl)-4,4',5,5'-tetraphenylbiimidazole, 2,2'-bis(2,3-dichlorophenyl)-4,4',5,5'-tetraphenylbiimidazole (for example, see Japanese Patent Laid-Open No. 06-75372 and Japanese Patent Laid-Open No. 06-75373), 2,2'-bis(2-chlorophenyl)-4,4',5,5'-tetraphenyl biimidazole, 2,2'-bis(2-chlorophenyl)-4,4',5,5'-tetra(alkoxyphenyl)biimidazole, 2,2'-bis(2-chlorophenyl)-4,4',5,5'-tetra(dialkoxyphenyl)biimidazole, 2,2'-bis(2-chlorophenyl)-4,4',5,5'-tetra(trialkoxyphenyl)biimidazole (for example, see Japanese Patent No. 48-38403 and Japanese Patent Laid-Open No. 62-174204), and an imidazole compound in which phenyl groups at the 4,4',5,5' positions are each substituted with a carboalkoxy group (for example, see Japanese Patent Laid-Open No. 7-10913). Of these, a compound represented by the following formula or a mixture thereof is preferable.

[Formula 19]

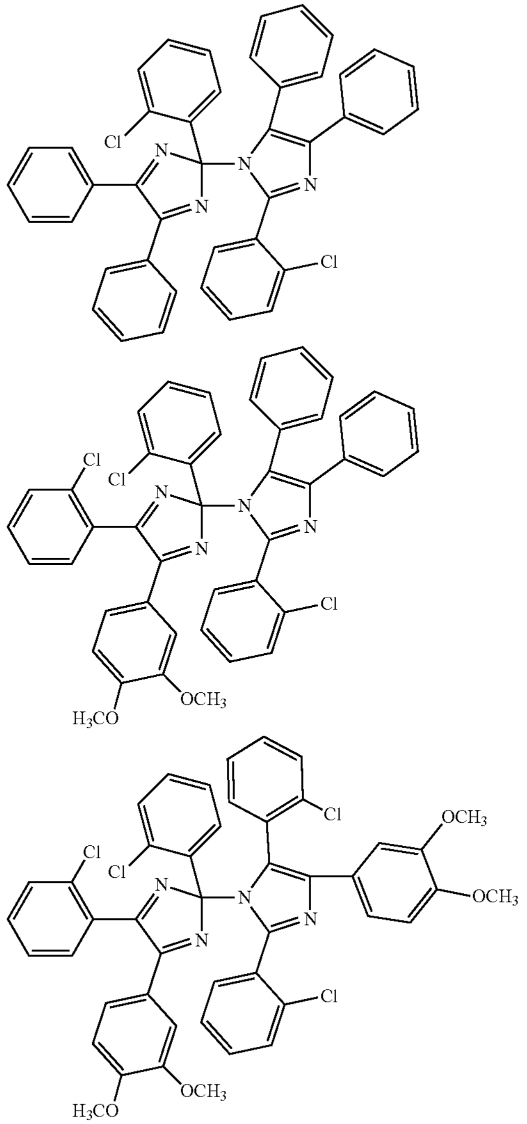

Examples of the triazine compound include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, and 2,4-bis(trichloromethyl)-6-[2-(3,4-dimethoxyphenyl)ethenyl]-1,3,5-triazine. Of these, 2,4-bis(trichloromethyl)-6-piperonyl-1,3,5-triazine is preferable.

Examples of the acylphosphine compound include bis(2,4,6-trimethylbenzoyl)phenylphosphine oxide and (2,4,6-trimethylbenzoyl)diphenylphosphine oxide.

Only one photopolymerization initiator other than the oxime compound (1) may be used alone, or two or more photopolymerization initiators may be used in combination. In the case where two or more photopolymerization initiators are used in combination, the oxime compound (1) may be combined with a different photopolymerization initiator other than oxime compounds other than the oxime compound (1), biimidazole compounds, triazine compounds and acylphosphine compounds.

Examples of the other photopolymerization initiator include benzoin compounds such as benzoin, benzoin methyl ether, benzoin ethyl ether, benzoin isopropyl ether, and benzoin isobutyl ether; benzophenone compounds such as benzophenone, methyl o-benzoylbenzoate, 4-phenylbenzophenone, 4-benzoyl-4'-methyldiphenyl sulfide, 3,3',4,4'-tetra(tert-butylperoxycarbonyl)benzophenone, 2,4,6-trimethylbenzophenone, and 4,4'-bis(diethylamino)benzophenone; quinone compounds such as 9,10-phenanthrene quinone, 2-ethylanthraquinone, and camphorquinone; 10-butyl-2-chloroacridone, benzyl, methyl phenylglyoxylate, and a titanocene compound.

In the case where the resin composition contains the photopolymerization initiator (E), the content of the photopolymerization initiator (E) in the resin composition is preferably 0.1 parts by mass or more and 300 parts by mass or less, and more preferably 0.1 parts by mass or more and 200 parts by mass or less, based on 100 parts by mass of the photopolymerizable compound (D). Further, the content of the photopolymerization initiator (E) in the resin composition is preferably 0.1 parts by mass or more and 30 parts by mass or less, and more preferably 1 part by mass or more and 20 parts by mass or less, based on 100 parts by mass of the total amount of the resin (C) and the photopolymerizable compound (D). When the content of the photopolymerization initiator (E) is within the above range, the resin composition tends to have high sensitivity and the exposure time tends to be shortened, so that the productivity of the cured material layer of the resin composition tends to improve.

The content ratio of the oxime compound (1) in the photopolymerization initiator (E) is preferably 30% by mass or more and 100% by mass or less, more preferably 50% by mass or more and 100% by mass or less, still more preferably 80% by mass or more and 100% by mass or less, yet still more preferably 90% by mass or more and 100% by mass or less, particularly preferably 95% by mass or more and 100% by mass or less, and most preferably 100% by mass, based on the total amount of the photopolymerization initiator (E), from the viewpoint of increasing the outgoing light intensity of the resin layer (wavelength conversion film or the like).

[2-7] Photopolymerization Initiation Aid (E1)

The resin composition may further contain one or more photopolymerization initiation aids (E1) in combination with the photopolymerization initiator (E). The photopolymerization initiation aid (E1) is a compound or a sensitizer used to promote the polymerization of the photopolymerizable compound (D) initiated by the photopolymerization initiator (E). Examples of the photopolymerization initiation aid (E1) include amine compounds, alkoxyanthracene compounds, thioxanthone compounds, and carboxylic acid compounds.

Examples of the amine compound include triethanolamine, methyldiethanolamine, triisopropanolamine, methyl 4-dimethylaminobenzoate, ethyl 4-dimethylaminobenzoate, isoamyl 4-dimethylaminobenzoate, 2-dimethylaminoethyl benzoate, 2-ethylhexyl 4-dimethylaminobenzoate, N,N-dimethylparatoluidine, 4,4'-bis(dimethylamino)benzophenone (common name: Michler's ketone), 4,4'-bis(diethylamino)benzophenone, and 4,4'-bis(ethylmethylamino)benzophenone, and of these, 4,4'-bis(diethylamino)benzophenone is preferable. Commercially available products such as EAB-F (manufactured by Hodogaya Chemical Co., Ltd.), may be used.

Examples of the alkoxy anthracene compound include 9,10-dimethoxyanthracene, 2-ethyl-9,10-dimethoxyanthracene, 9,10-diethoxyanthracene, 2-ethyl-9,10-diethoxyanthracene, 9,10-dibutoxyanthracene, and 2-ethyl-9,10-dibutoxyanthracene.

Examples of the thioxanthone compound include 2-isopropylthioxanthone, 4-isopropylthioxanthone, 2,4-diethylthioxanthone, 2,4-dichlorothioxanthone, and 1-chloro-4-propoxythioxanthone.

Examples of the carboxylic acid compound include phenylsulfanylacetic acid, methylphenylsulfanylacetic acid, ethylphenylsulfanylacetic acid, methylethylphenylsulfanylacetic acid, dimethylphenylsulfanylacetic acid, methoxyphenylsulfanylacetic acid, dimethoxyphenylsulfanylacetic acid, chlorophenylsulfanylacetic acid, dichlorophenylsulfanylacetic acid, N-phenylglycine, phenoxyacetic acid, naphthylthioacetic acid, N-naphthylglycine, and naphthoxyacetic acid.

When the resin composition contains a photopolymerization initiation aid (E1), the content of the photopolymerization initiation aid (E1) in the resin composition is preferably 0.1 parts by mass or more and 300 parts by mass or less, and more preferably 0.1 parts by mass or more and 200 parts by mass or less, based on 100 parts by mass of the photopolymerizable compound (D). Further, the content of the photopolymerization initiation aid (E1) in the resin composition is preferably 0.1 parts by mass or more and 30 parts by mass or less, and more preferably 1 part by mass or more and 20 parts by mass or less, based on 100 parts by mass of the total amount of the resin (C) and the photopolymerizable compound (D). When the content of the photopolymerization initiation aid (E1) is within the above range, the sensitivity of the resin composition can be further increased.

[2-8] Solvent (F)

The resin composition may contain one or more solvents (F). The solvent (F) is not particularly limited as long as it dissolves the resin (C), and any solvent which has been used conventionally in the art can be used. Examples of the solvent (C) include an ester solvent (a solvent which contains —COO— but does not contain —O— in its molecule), an ether solvent (a solvent which contains —O— but does not contain —COO— in its molecule), an ether ester solvent (a solvent which contains —COO— and —O— in its molecule), a ketone solvent (a solvent which contains —CO— but does not contain —COO— in its molecule), an alcohol solvent (a solvent which contains OH but does not contain —O—, —CO— nor COO— in its molecule), an aromatic hydrocarbon solvent, an amide solvent, and dimethyl sulfoxide.

In the case where the resin composition further contains the photopolymerizable compound (D) and a photopolymerization initiator (E), the solvent (F) preferably dissolves the photopolymerizable compound (D) and the photopolymerization initiator (E).

Examples of the ester solvent include methyl lactate, ethyl lactate, n-butyllactate, methyl 2-hydroxy isobutanoate, ethyl acetate, n-butylacetate, isobutylacetate, n-pentyl formate, isopentyl acetate, n-butylpropionate, isopropyl butyrate, ethyl butyrate, n-butylbutyrate, methyl pyruvate, ethyl pyruvate, propyl pyruvate, methyl acetoacetate, ethyl acetoacetate, cyclohexanol acetate (cyclohexyl acetate, cyclohexyl acetate), and γ-butyrolactone.

Examples of the ether solvent include ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monopropyl ether, propylene glycol monobutyl ether, 3-methoxy-1-butanol, 3-methoxy-3-methylbutanol, tetrahydrofuran, tetrahydropyran, 1,4-dioxane, diethylene glycol dimethyl ether, diethylene glycol diethyl ether, diethylene glycol methyl ethyl ether, diethylene glycol dipropyl ether, diethylene glycol dibutyl ether, anisole, phenetol, and methyl anisole.

Examples of the ether ester solvent include methyl methoxyacetate, ethyl methoxyacetate, butyl methoxyacetate, methyl ethoxyacetate, ethyl ethoxyacetate, methyl 3-methoxypropionate, ethyl 3-methoxypropionate, methyl 3-ethoxypropionate, ethyl 3-ethoxypropionate, methyl 2-methoxypropionate, ethyl 2-methoxypropionate, propyl 2-methoxypropionate, methyl 2-ethoxy propionate, ethyl 2-ethoxypropionate, methyl 2-methoxy-2-methylpropionate, ethyl 2-ethoxy methylpropionate, 3-butyl methoxyacetate, 3-methyl-3-butyl methoxyacetate, propylene glycol monomethyl ether acetate, propylene glycol monoethyl ether acetate, propylene glycol monopropyl ether acetate, ethylene glycol monomethyl ether acetate, ethylene glycol monoethyl ether acetate, diethylene glycol monoethyl ether acetate, and diethylene glycol monobutyl ether acetate.

Examples of the ketone solvent include 4-hydroxy-4-methyl-2-pentanone, acetone, 2-butanone, 2-heptanone, 3-heptanone, 4-heptanone, 4-methyl-2-pentanone, cyclopentanone, cyclohexanone, and isophorone.

Examples of the alcohol solvent include methanol, ethanol, propanol, butanol, hexanol, cyclohexanol, ethylene glycol, propylene glycol, and glycerin.

Examples of the aromatic hydrocarbon solvent include benzene, toluene, xylene, and mesitylene.

Examples of the amide solvent include N,N-dimethylformamide, N,N-dimethylacetamide, and N-methylpyrrolidone.

The solvent (F) is preferably propylene glycol monomethyl ether acetate, ethyl lactate, propylene glycol monomethyl ether, ethyl 3-ethoxypropionate, ethylene glycol monomethyl ether, diethylene glycol monomethyl ether, diethylene glycol monoethyl ether, 4-hydroxy-4-methyl-2-pentanone, cyclohexanol acetate, or toluene, or a mixture of two or more of these, and propylene glycol monomethyl ether acetate is more preferably contained.

In the case where the solvent (F) contains propylene glycol monomethyl ether acetate, the content ratio of propylene glycol monomethyl ether acetate in the solvent (F) is preferably 30% by mass or more, more preferably 40% by mass or more, still more preferably 50% by mass or more, and may be 60% by mass or more, 70% by mass or more, 80% by mass or more, or 90% by mass or more.

The solvent (F) is a component other than the solid content of the resin composition, and for example, the solvent contained in the light scattering agent (A), the quantum dots (B), the resin (C), or the like is also included in the solvent (F).

The content ratio of the solvent (F) in the resin composition is the ratio of the total mass of all the solvents contained in the composition to the total amount of the composition, and is, for example, based on the total amount of the resin composition, 40% by mass or more and 95% by mass or less, preferably 55% by mass or more and 90% by mass or less. In other words, the solid content of the resin composition is preferably 5% by mass or more and 60% by mass or less, and more preferably 10% by mass or more and 45% by mass or less. When the content ratio of the solvent (F) is within the above range, there is a tendency that the flatness of the resin layer becomes better and a resin layer having an appropriate film thickness is easily formed.

[2-9] Antioxidant (G)

The resin composition may further contain one or more antioxidants (G).

The antioxidant (G) is not particularly limited as long as it is an antioxidant that is generally used industrially, and a phenol-based antioxidant, a phosphorus-based antioxidant, a phosphorus/phenol composite antioxidant, a sulfur-based antioxidant, and the like can be used.

The phosphorus/phenol composite antioxidant may be a compound having one or more phosphorus atoms and one or more phenol structures in its molecule. In particular, from the viewpoint of the developability and outgoing light intensity of the resin layer (wavelength conversion film or the like), the antioxidant (G) preferably contains a phosphorus/phenol composite antioxidant.

Examples of the phenol-based antioxidant include Irganox® 1010 (Irganox 1010: pentaerythritol tetrakis[3-(3,5-di-tert-butyl-4-hydroxyphenyl)propionate], manufactured by BASF Japan Ltd.), Irganox 1076 (Irganox 1076: Octadecyl-3-(3,5-di-tert-butyl-4-hydroxyphenyl)propionate, manufactured by BASF Japan Ltd.), Irganox 1330 (Irganox 1330: 3,3',3",5,5',5"-hexa-tert-butyl-α,α',α"-(mesitylene-2,4,6-triyl)tri-p-cresol, BASF Japan Ltd.), Irganox 3114 (Irganox 3114: 1,3,5-tris(3,5-di-tert-butyl-4-hydroxybenzyl)-1,3,5-triazine-2,4,6(1H,3H,5H)-trione, manufactured by BASF Japan Ltd.), Irganox 3790 (Irganox 3790: 1,3,5-tris((4-tert-butyl-3-hydroxy-2,6-xylyl)methyl)-1,3,5-triazine-2,4,6(1H,3H,5H)-trione, manufactured by BASF Japan Ltd.), Irganox 1035 (Irganox 1035: thiodiethylenebis[3-(3,5-di-tert-butyl-4 hydroxyphenyl)propionate], manufactured by BASF Japan Ltd.), Irganox 1135 (Irganox 1135: 3,5-bis(1,1-dimethylethyl)-4-hydroxy-C7-C9 side-chain alkyl ester of benzene propanoic acid, manufactured by BASF Japan Ltd.), Irganox 1520 L (Irganox 1520 L: 4,6-bis(octylthiomethyl)-o-cresol, manufactured by BASF Japan Ltd.), Irganox 3125 (Irganox 3125, manufactured by BASF Japan Ltd.), Irganox 565 (Irganox 565: 2,4-bis(n-octylthio)-6-(4-hydroxy-3',5'-di-tert-butylanilino)-1,3,5-triazine, manufactured by BASF Japan Ltd.), ADK STAB® AO-80 (ADK STAB AO-80: 3,9-bis(2-(3-(3-tert-butyl-4-hydroxy methylphenyl)propionyloxy)-1,1-dimethylethyl)-2,4,8,10-tetraoxaspiro(5,5)undecane, manufactured by ADEKA Corporation), SUMILIZER® BHT, SUMILIZER GA-80, SUMILIZER GS (manufactured by Sumitomo Chemical Co., Ltd.), Cyanox® 1790 (Cyanox 1790, manufactured by Cytec Industries Inc.), and vitamin E (manufactured by Eisai Co., Ltd.).

Examples of the phosphorus-based antioxidant include Irgafos® 168 (Irgafos 168: tris(2,4-di-tert-butylphenyl) phosphite, manufactured by BASF Japan Ltd.), Irgafos 12 (Irgafos 12: tris[2-[[2,4,8,10-tetra-tert-butyldibenzo[d,f][1,3,2]-dioxaphosphine-6-yl]oxy]ethyl]amine, manufactured by BASF Japan Ltd.), Irgafos 38 (Irgafos 38: bis(2,4-bis(1,1-dimethylethyl)-6-methylphenyl)ethyl ester phosphite, manufactured by BASF Japan Ltd.), ADK STAB® 329K, ADK STAB PEP36, ADK STAB PEP-8 (all manufactured by ADEKA Corporation), Sandstab P-EPQ (manufactured by Clariant AG), Weston® 618, Weston 619G (manufactured by GE), and Ultranox 626 (manufactured by GE).

Examples of the phosphorus/phenol composite antioxidant include SUMILIZER® GP (6-[3-(3-tert-butyl-4-hydroxy-5-methylphenyl)propoxy]-2,4,8,10-tetra-tert-butyldibenz[d,f][1.3.2]dioxaphosphepine) (manufactured by Sumitomo Chemical Co., Ltd.).

Examples of the sulfur-based antioxidant include dialkyl thiodipropionate compounds such as dilauryl thiodipropionate, dimyristyl thiodipropionate, and distearate thiodipropionate; and β-alkylmercaptopropionic acid ester compounds of polyols such as tetrakis[methylene(3-dodecylthio) propionate]methane.

In the case where the resin composition contains the antioxidant (G), the content of the antioxidant (G) in the resin composition is, for example, 1 part by mass or more and 50 parts by mass or less based on 100 parts by mass of the resin (C), and is preferably 5 parts by mass or more and 40 parts by mass or less, more preferably 7 parts by mass or more and 30 parts by mass or less, and still more preferably 11 parts by mass or more and 25 parts by mass or less from the viewpoint of the heat resistance and the like of the resin layer.

[2-10] Leveling Agent (H)

The resin composition may further contain one or more leveling agents (H). The surface tension of the resin layer can be adjusted by the kind, addition amount, dispersion state in the resin layer, or the like of the leveling agent (H).

Examples of the leveling agent (H) include a silicone-based surfactant, a fluorine-based surfactant, and a silicone-based surfactant having a fluorine atom. These may have a polymerizable group at its side chain. The leveling agent (H) is preferably a fluorine-based surfactant from the viewpoint of the developability and outgoing light intensity of the resin layer (wavelength conversion film or the like).

Examples of the silicone-based surfactant include a surfactant having a siloxane bond in its molecule. Specific examples thereof include Toray Silicone DC3PA, Toray Silicone SH7PA, Toray Silicone DC11PA, Toray Silicone SH21PA, Toray Silicone SH28PA, Toray Silicone SH29PA, Toray Silicone SH30PA, and Toray Silicone SH8400 (manufactured by Dow Corning Toray Co., Ltd.); KP321, KP322, KP323, KP324, KP326, KP340, and KP341 (manufactured by Shin-Etsu Chemical Co., Ltd.); and TSF400, TSF401, TSF410, TSF4300, TSF4440, TSF4445, TSF4446, TSF4452, and TSF4460 (manufactured by Momentive Performance Materials Inc.).

Examples of the fluorine-based surfactant include a surfactant having a fluorocarbon chain in its molecule. Specific examples thereof include Fluorad® FC430 and Fluorad FC431 (manufactured by Sumitomo 3M Limited); MEGAFACE® F142D, MEGAFACE F171, MEGAFACE F172, MEGAFACE F173, MEGAFACE F177, MEGAFACE F183, MEGAFACE F554, MEGAFACE F575, MEGAFACE R30, and MEGAFACE RS-718-K (manufactured by DIC Corporation); EFTOP® EF301, EFTOP EF303, EFTOP EF351, and EFTOP EF352 (manufactured by Mitsubishi Materials Electronic Chemicals Co., Ltd.); Surflon® 5381, Surflon 5382, Surflon SC101, and Surflon SC105 (manufactured by Asahi Glass Co., Ltd.); and E5844 (manufactured by Daikin Fine Chemical Laboratory).

Examples of the silicone-based surfactant having a fluorine atom include a surfactant having a siloxane bond and a fluorocarbon chain in its molecule. Specific examples thereof include MEGAFACE® R08, MEGAFACE BL20, MEGAFACE F475, MEGAFACE F477, and MEGAFACE F443 (manufactured by DIC Corporation).

When the resin composition contains a leveling agent (H), the content ratio of the leveling agent (H) in the resin composition is, for example, based on the total amount of the resin composition, 0.001% by mass or more and 1.0% by mass or less, preferably 0.005% by mass or more and 0.75% by mass or less, more preferably 0.01% by mass or more and 0.5% by mass or less, and still more preferably 0.05% by mass or more and 0.5% by mass or less. When the content ratio of the leveling agent (H) is within the above range, the flatness of the resin layer can be further improved.

If necessary, the resin composition may further contain an additive known in the art, such as a polymerization inhibitor, a filler, other polymeric compound, an adhesion promoter, a light stabilizer, or a chain transfer agent.

[3] Method for Producing Resin Composition

The resin composition can be produced by a method including a step of mixing the light scattering agent (A), the resin (C), and other components used as necessary. The method for producing the resin composition may further include a step of preparing the resin (C).

[4] Method for Producing Resin Layer

The resin layer can be formed from a resin composition. The resin layer can be formed by, for example, a method including a step of applying a resin composition to the substrate layer and a drying step that is performed as necessary. The resin composition is preferably a curable resin composition further containing a photopolymerizable compound (D) and a photopolymerization initiator (E) in addition to the light scattering agent (A) and the resin (C).

The resin layer is preferably a cured material layer formed from the curable resin composition. The resin layer, which is a cured material layer, can be formed by a method including a step of applying the curable resin composition to the substrate layer, a drying step that is performed as necessary, and a step of curing the curable resin composition by the action of light and, if necessary, further by the action of heat.

The cured material layer may be formed on the entire surface of the substrate layer or may be formed on a part of the substrate layer as a cured pattern.

Examples of the method for forming the cured material layer on a part of the substrate layer include a photolithography method, an inkjet method, and a printing method. Of these, the photolithography method is preferable. The photolithography method is a method in which the curable resin composition is applied to the substrate layer and dried to form a composition layer, and the composition layer is exposed to light through a photomask and developed.

Examples of a method for forming the cured material layer on the entire surface of the substrate layer include a method in which the curable resin composition is applied to the substrate layer and dried to form a composition layer, and the composition layer is heated and/or the entire surface of the composition layer is exposed to light.

The formation of a cured pattern using a photolithography method can be carried out using a known or conventional device or under known or conventional conditions. For example, it can be produced as follows.

First, the curable resin composition is applied onto a substrate, and then dried by heat-drying (prebaking) and/or drying under reduced pressure to remove volatile components including a solvent from the composition, thereby producing a composition layer. Examples of the coating method include a spin coating method, a slit coating method, and a slit and spin coating method.

The temperature to be employed in the case where heat-drying is carried out is preferably 30° C. or more and 120° C. or less, more preferably 50° C. or more and 110° C. or less. The heating time is preferably 10 seconds or more and 60 minutes or less, and more preferably 30 seconds or more and 30 minutes or less.

In the case where drying under reduced pressure is carried out, it is preferred to carry out the drying procedure under a pressure of 50 Pa or more and 150 Pa or less and at a temperature of 20° C. or more and 25° C. or less.

The film thickness of the composition layer is not particularly limited, and may be selected appropriately depending on the desired film thickness of the cured pattern to be produced, and is, for example, 1 μm or more and 20 μm or less, preferably 3 μm or more and 18 μm or less, more preferably 5 μm or more and 14 μm or less, and still more preferably 7 μm or more and 12 μm or less.

Next, the composition layer is exposed to light through a photomask for forming a desired cured pattern. The pattern on the photomask is not particularly limited.

The light sources used for exposure are preferably a light source that emits light having a wavelength of 250 nm or more to 450 nm or less. For example, light in the vicinity of 436 nm, 408 nm, or 365 nm may be selectively extracted from the light having the wavelength according to the absorption wavelength of the photopolymerization initiator (E) by a band-pass filter. Specific examples of the light source include a mercury lamp, a light-emitting diode, a metal halide lamp, and a halogen lamp.

A light-exposing device such as a mask aligner and a stepper is preferably used because the device is capable of emitting a parallel light beam uniformly over the whole area of the exposed surface or aligning the photomask accurately to the substrate which has the composition layer formed thereon. The exposed composition layer is cured by polymerizing the photopolymerizable compound (D) and the like contained in the composition layer.

By bringing the exposed composition layer into contact with a developer for development, the unexposed portion of the composition layer is dissolved and removed in the developer to obtain a cured pattern. Examples of the developer include an aqueous solution of an alkaline compound such as potassium hydroxide, sodium hydrogen carbonate, sodium carbonate and tetramethylammonium hydroxide; and organic solvents. The concentration of the alkaline compound in the aqueous solution is preferably 0.01% by mass or more and 10% by mass or less, and more preferably 0.03% by mass or more and 5% by mass or less. Examples of the organic solvent include the same as the solvent (F). The developer may contain a surfactant.

The developing method may be any of a paddle method, a dipping method, a spray method and the like. Further, the substrate may be inclined at any degree during development.

The cured pattern obtained by development is preferably further subjected to heating (post-baking). The heating temperature is carried out is preferably 150° C. or more and 250° C. or less, more preferably 160° C. or more and 235° C. or less. The heating time is preferably 1 minute or more and 120 minutes or less, and more preferably 10 minutes or more and 60 minutes or less. By performing heating after development, polymerization of the unreacted photopolymerizable compound (D) and the like contained in the cured pattern can be advanced, and therefore, a cured pattern having more excellent chemical resistance can be obtained.

[5] Substrate Layer

Examples of the substrate layer include a glass base material, a film base material, and a silicon wafer base material. Examples of a resin constituting the film base material include thermoplastic resins such as polyolefin-based resins such as linear polyolefin-based resins (polyethylene-based resins, polypropylene-based resins, and the like), cyclic polyolefin-based resins (norbornene-based resins and the like); cellulose-based resins such as triacetyl cellulose and diacetyl cellulose; polyester-based resins such as polyethylene terephthalate and polybutylene terephthalate; polyvinyl alcohol-based resins; polycarbonate-based resins; (meth)acrylic resins such as methyl methacrylate resins; polystyrene-based resins; polyvinyl chloride-based resins; acrylonitrile-butadiene-styrene-based resins; acrylonitrile-styrene-based resins; polyvinyl acetate-based resins; polyvinylidene chloride-based resins; polyamide-based resins; polyacetal-based resins; modified polyphenylene ether-based resins; polysulfone-based resins; polyether sulfone-based resins; polyether ketone-based resins; polyphenylene sulfide-based resins; polyphenylene oxide-based resins; polyarylate-based resins; polyamide-imide-based resins; and polyimide-based resins.

In addition, the substrate layer may be a layered substrate or a layered film and may be, for example, a glass base material or film base material having a functional layer such as a hardcoat layer or a primer layer.

The substrate layer may have been subjected to a pretreatment by which the surface tension of the surface can be adjusted. Examples of the pretreatment include washing with a solvent such as an alcohol or acetone, an acid treatment, an alkali treatment, a plasma treatment, a corona treatment, and the like. When an appropriate pretreatment is selected for the substrate layer on which the resin layer is desired to be layered, it is possible to prevent the generation of a defect portion in the resin layer more than in untreated substrate layers or to increase the adhesion of the resin layer to the substrate layer.

The thickness of the substrate layer is usually 5 or more and 300 μm or less and preferably 20 μm or more and 200 μm or less.

<Display Device>

As described above, the resin layer 20 containing quantum dots (B) has a function of converting the wavelength of irradiation light and thus can be used as a color conversion layer (wavelength conversion film) of a display device. Examples of such a display device include display devices disclosed in Japanese Patent Laid-Open No. 2006-309219, Japanese Patent Laid-Open No. 2006-310303, Japanese Patent Laid-Open No. 2013-15812, Japanese Patent Laid-Open No. 2009-251129, and Japanese Patent Laid-Open No. 2014-2363. Specific examples of the display device include a liquid crystal display device, an organic EL display device, an inorganic EL display device, and the like.

EXAMPLES

Hereinafter, the present invention will be described in more detail by way of examples. Unless otherwise specified, "%" and "part" in the example are % by mass and parts by mass.

[Measurement of Surface Tension σs (25° C.) of Substrate Layer]

The surface tension of a substrate layer was measured by the following procedure.

(1) 1.0 μL of a droplet of water was added dropwise onto the surface of the substrate layer on which a resin layer was disposed under an environment of 25° C., and the contact angle θs of the substrate layer with respect to water was measured using a contact angle measuring device (manufactured by Kyowa Interface Science Co., Ltd., DM700) by a θ/2 method.

(2) 1.0 μL of a droplet of diiodomethane was added dropwise onto the surface of the substrate layer on which the resin layer is disposed under an environment of 25° C., and the contact angle θs' of the substrate layer with respect to diiodomethane was measured using the contact angle measuring device by the θ/2 method.

(3) In the Young Owens formula represented by the following formula:

$$(1+\cos\theta)\gamma_L=2[(\gamma_s^d\gamma_L^d)^{1/2}+(\gamma_s^p\gamma_L^p)^{1/2}],$$

θs obtained in (1) was assigned to θ (the contact angle of solid with respect to liquid), and known values regarding water of 21.8 (mN/m) and 51.0 (mN/m) were assigned to $\gamma_L^d$ (the dispersion force component of the surface tension of liquid) and $\gamma_L^p$ (the polar power component of the surface tension of liquid), respectively, thereby obtaining an equation 1. $\gamma_L$ in the Young Owens formula is $\gamma_L^d+\gamma_L^p$.

(4) Similarly, in the Young Owens formula, θs' obtained in (2) was assigned to θ, and known values regarding diiodomethane of 49.5 (mN/m) and 1.3 (mN/m) were assigned to $\gamma_L^d$ and $\gamma_L^p$, respectively, thereby obtaining an equation 2.

(5) From the simultaneous equation of the equations 1 and 2, $\gamma_S^d$ and $\gamma_S^d$ were obtained, and as the sum of these, the surface tension σs (mN/m) at 25° C. of the resin composition was obtained.

[Measurement of Surface Tension σr (25° C.) of Resin Layer]

The surface tension of the resin layer was measured by the following procedure.

(1) 1.0 μL of a droplet of water was added dropwise onto the outside surface (the surface opposite to the substrate layer side) of the resin layer in the obtained layered body under an environment of 25° C., and the contact angle θr of the substrate layer with respect to water was measured using the contact angle measuring device (manufactured by Kyowa Interface Science Co., Ltd., DM700) by the θ/2 method.

(2) 1.0 μL of a droplet of diiodomethane was added dropwise onto the outside surface (the surface opposite to the substrate layer side) of the resin layer in the obtained layered body under an environment of 25° C., and the contact angle θr' of the substrate layer with respect to diiodomethane was measured using the contact angle measuring device by the θ/2 method.

(3) In the Young Owens formula represented by the following formula:

$$(1+\cos\theta)\gamma_L=2[(\gamma_s^d\gamma_L^d)^{1/2}+(\gamma_s^p\gamma_L^p)^{1/2}],$$

θr obtained in (1) was assigned to θ (the contact angle of solid with respect to liquid), and known values regarding water of 21.8 (mN/m) and 51.0 (mN/m) were assigned to $\gamma_L^d$ (the dispersion force component of the surface tension of liquid) and $\gamma_L^p$ (the polar power component of the surface tension of liquid), respectively, thereby obtaining an equation 1. $\gamma_L$ in the Young Owens formula is $\gamma_L^d+\gamma_L^p$.

(4) Similarly, in the Young Owens formula, θr' obtained in (2) was assigned to θ, and known values regarding diiodomethane of 49.5 (mN/m) and 1.3 (mN/m) were assigned to $\gamma_L^d$ and $\gamma_L^p$, respectively, thereby obtaining an equation 2.

(5) From the simultaneous equation of the equations 1 and 2, $\gamma_S^d$ and $\gamma_S^p$ were obtained, and the surface tension σr (mN/m) at 25° C. was obtained as the sum thereof.

[Evaluation of Defect Portion of Resin Layer on Substrate Layer]

The layered body was placed on a black plate so that the substrate layer side came into contact with the black plate. The layered body was irradiated with light from a fluorescent lamp above the layered body, and an image (photograph) of the resin layer side of the layered body was acquired. At this time, a defect portion of the resin layer appears black since the resin layer is not present on the substrate layer or the thickness of the resin layer is relatively extremely reduced. On the other hand, a good region with no defect portions exhibits a color clearly different from black. The area ratio of a region exhibiting a color other than black when the total of a region exhibiting a black color and the region exhibiting a color other than black was regarded as 100% was calculated using image processing software (ImageJ), and the non-defect portion region of the resin layer was evaluated according to the following evaluation standards.

A: The area ratio is 80% or more

B: The area ratio is 50% or more and less than 80%

C: The area ratio is less than 50%

[Weight-Average Molecular Amount (in Terms of Standard Polystyrene) of Resin]

The weight-average molecular weight (Mw) of the resin was measured by the GPC method under the following conditions.

Equipment: K2479 (manufactured by Shimadzu Corporation)

Column: SHIMADZU Shim-pack GPC-80M

Column temperature: 40° C.

Solvent: tetrahydrofuran

Flow rate: 1.0 mL/min

Detector: RI

Standard for calibration; TSK STANDARD POLYSTYRENE F-40, F-4, F-288, A-2500, A-500 (manufactured by Tosoh Corporation)

[Acid Value of Resin]

3 g of the resin solution was finely weighed, dissolved in a mixed solvent of 90 g of acetone and 10 g of water, and the acid value of the resin solution was measured by an automatic titrator (manufactured by HIRANUMA Co., Ltd., trade name: COM-555) using the KOH aqueous solution specified in 0.1 as the titrant, and the acid value (AV) per 1 g of solid content was determined from the acid value of the solution and the solid content of the solution.

[Solid Content of Resin Solution]

About 1 g of the resin solution was weighed in an aluminum cup, dried at 180° C. for 1 hour, and then the mass was measured. The solid content (% by mass) of the resin solution was calculated from the mass reduction amount.

Production Example 1: Preparation of Resin (C-1) Solution

After 110 parts of propylene glycol monomethyl ether acetate (hereinafter, referred to as "PGMEA") was put into a flask equipped with a stirrer, a reflux cooling tube with a thermometer, a dropping funnel, and a nitrogen introduction tube, the mixture was stirred while purging nitrogen, and the temperature was raised to 80° C. A solution obtained by dissolving 25 parts of dicyclopentanyl methacrylate, 26 parts of methyl methacrylate, 16 parts of methacrylic acid, and 11 parts of 2,2'-azobis(2,4-dimethylvaleronitrile) in 110 parts of PGMEA was dropped from a dropping funnel into a flask, and stirred at 80° C. for 3 hours.

Next, 16 parts of glycidyl methacrylate, 0.4 parts of 2,2'-methylenebis(4-methyl-6 tert-butylphenol), and 0.8 parts of triphenylphosphine were put into a flask, and the temperature was raised to 110° C. and stirred for 8 hours to react the carboxylic acid in the polymer with the epoxy group to introduce a polymerizable unsaturated bond. Then, 17 parts of 1,2,3,6-tetrahydrophthalic acid anhydride was added and the reaction was continued for 3 hours to introduce carboxylic acid groups into the side chains. The reaction solution was cooled to room temperature to obtain a resin (C-1) solution.

The resin (C-1) had a weight-average molecular weight in terms of standard polystyrene of 7600, a molecular weight distribution of 2.1, and an acid value of 100 mg KOH/g, and the solid content in the resin (C-1) solution was 40% by mass.

Production Example 2: Preparation of Resin (C-2) Solution

A resin (C-2) solution was obtained in the same manner as in Production Example 1 except that the amount of 2,2'-azobis(2,4-dimethylvaleronitrile) used was set to 14 parts.

The resin (C-2) had a weight-average molecular weight of 5200 in terms of standard polystyrene, a molecular weight distribution of 2.2, and an acid value of 100 mg KOH/g, and the solid content in the resin (C-2) solution was 40% by mass.

Production Example 3: Preparation of Dispersion of Light Scattering Agent (A-1)

DISPERBYK21116 (manufactured by BYK Japan KK) was added to 70 parts of titanium oxide nanoparticles in a solid content of 3 parts and PGMEA in a total amount of 100 parts, and the mixture was stirred with a paint shaker until it was sufficiently dispersed to obtain a dispersion (solid content: 73%) of a light scattering agent (A-1).

Production Example 4: Preparation of Dispersion of Quantum Dots (B-1)

A toluene dispersion of InP/ZnSeS quantum dots coordinated with oleic acid as a ligand was prepared. The dispersion was distilled under reduced pressure to remove toluene. To 30 parts of the solid content, 70 parts of cyclohexyl acetate was added to obtain a dispersion (solid content: 30%) of quantum dots (B-1).

Production Example 5: Preparation of Quantum Dot Dispersion Containing Organic Ligand (X-1) and Organic ligand (X-2)

A predetermined amount of an organic ligand (X-1) was added to the dispersion of the quantum dots (B-1) obtained in Production Example 4 and stirred at 80° C. for two hours, thereby obtaining a quantum dot dispersion containing the organic ligand (X-1) and an organic ligand (X-2).

The organic ligand (X-2) refers to oleic acid having the InP/ZnSeS quantum dots coordinated with oleic acid used in Production Example 4.

Production Examples 6 to 10: Preparation of Resin Compositions 6 to 10

Regarding Production Examples 6, 7, 8, and 10, curable resin compositions were prepared by mixing the resin (C-1) solution or the resin (C-2) solution obtained in Production Example 1 or 2, the light scattering agent (A-1) dispersion obtained in Production Example 3, and other components shown in Table 1 in a predetermined amount.

Regarding Production Example 9, a curable resin composition was prepared by mixing the resin (C-1) solution obtained in Production Example 1, the light scattering agent (A-1) dispersion obtained in Production Example 3, the quantum dot dispersion obtained in Production Example 5, and other components shown in Table 1 in a predetermined amount.

The content of each component in the resin composition obtained from the addition amount is as shown in Table 1. In Table 1, the contents of components other than the solvent (F) are in terms of solid content (unit: parts by mass). The unit of the content of the solvent (F) is parts by mass. For example, the quantum dots (B-1) are blended as a dispersion of the quantum dots (B-1) in the preparation of the resin composition, and the content shown in Table 1 is the amount of the quantum dots (B-1) itself contained in the solution. The solvent (F) in Table 1 contains a solvent contained in the dispersion or solution used for preparing the resin composition.

The content of the organic ligand (X-2) in the resin composition shown in Table 1 was calculated based on the measurement of the concentration of the organic ligand (X-2) in the dispersion of the quantum dots (B-1) obtained in Production Example 4 according to the method [a] below.

[a] Measurement of Concentration of Organic Ligand (X-2)

After the solvent was removed by vacuum-drying the dispersion of the quantum dots (B-1) at 150° C., the weight change of the remaining solid content was measured at a temperature increasing rate of 5° C./min from 50° C. to 550° C. using a thermogravimetric analyzer "TGDTA 6200". The changed weight from 50° C. to 500° C. was regarded as the weight of the organic ligand (X-2), and the concentration of the organic ligand (X-2) in the dispersion of the quantum dots (B-1) was calculated.

TABLE 1

| | | Production example | | | | |
|---|---|---|---|---|---|---|
| | | 6 | 7 | 8 | 9 | 10 |
| Resin composition No. | | 6 | 7 | 8 | 9 | 10 |
| Light scattering agent (A) | A-1 | 5 | 5 | 5 | 5 | — |
| Quantum dots (B) | B-1 | — | — | — | 18.1 | — |
| Organic ligand | X-1 | 0.6 | 0.6 | 0.6 | 0.6 | 0.6 |
| | X-2 | — | — | — | 6.9 | — |
| Resin (C) | C-1 | 64.5 | — | 65.7 | 47.7 | 64.5 |
| | C-2 | — | 64.5 | — | — | — |
| Photopolymerizable compound (D) | D-1 | 10.1 | 10.1 | 9.5 | 6.5 | 12.6 |
| | D-2 | 14.3 | 14.3 | 13.7 | 9.7 | 16.8 |
| Photopolymerization initiator (E) | E-1 | 1.9 | 1.9 | 1.9 | 1.9 | 1.9 |
| Solvent (F) | F-1 | 100 | 100 | 100 | 100 | 100 |
| | F-2 | 86 | 86 | 86 | 86 | 86 |

TABLE 1-continued

| | | Production example | | | | |
|---|---|---|---|---|---|---|
| | | 6 | 7 | 8 | 9 | 10 |
| Antioxidant (G) | G-1 | 3.5 | 3.5 | 3.5 | 3.5 | 3.5 |
| Leveling agent (H) | H-1 | 0.1 | 0.1 | 0.1 | 0.1 | 0.1 |

The details of the abbreviations of the components shown in Table 1 are as follows.

[1] Organic ligand (X-1): 3-mercaptopropionic acid (manufactured by Tokyo Chemical Industry Co., Ltd., solid content: 100%)

[2] Organic ligand (X-2): Oleic acid

[3] Photopolymerizable compound (D-1): M-510 (polybasic modified acrylate, manufactured by Toagosei Co., Ltd., solid content: 100%)

[4] Photopolymerizable compound (D-2): A-9550 (dipentaerythritol polyacrylate, manufactured by SHIN-NAKAMURA CHEMICAL Co., Ltd., solid content: 100%)

[5] Photopolymerization initiator (E-1): compound represented by the following formula. Production was performed by the method disclosed in Japanese Patent Laid-Open No. 2011-132215 (solid content: 100%).

[Formula 20]

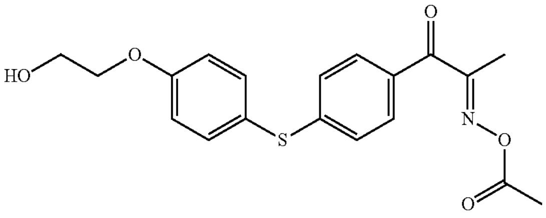

[6] Solvent (F-1): PGMEA (propylene glycol monomethyl ether acetate)

[7] Solvent (F-2): cyclohexyl acetate

[8] Antioxidant (G-1): SUMILIZER-GP (phosphorus/phenol composite antioxidant, manufactured by Sumitomo Chemical Co., Ltd., solid content: 100%)

[9] Leveling agent (H-1): F-554 (fluorine-based leveling agent, manufactured by DIC Corporation, solid content: 100%)

Examples 1 to 7, Comparative Example 1, Reference Example 1

The resin compositions shown in Table 2 were applied onto the substrate layers shown in Table 2 by a spin coat method so that the film thicknesses were 10 μm, and then prebaked at 100° C. for 3 minutes, to form curable composition layers. These substrate layers having the curable composition layers formed thereon were subjected to light irradiation at a light exposure (basis: 365 nm) of 80 mJ/cm$^2$ under an air atmosphere using an exposure device (TME-150RSK; manufactured by TOPCON CORPORATION) and after development, post-baking was performed at 100° C. for 60 minutes, to obtain layered bodies each composed of a substrate layer and a resin layer (cured material layer).

Among the substrate layers shown in Table 2, No. 1 was a glass plate (Eagle XG; manufactured by Corning Incorporated) that was used after being wiped with BEMCOT (manufactured by Asahi Kasei Corporation) impregnated with acetone (manufactured by FUJIFILM Wako Pure Chemical Corporation) and then dried with an air gun. No. 2 to No. 4 were an acrylic hardcoat layer-attached (meth) acrylic resin film, an acrylic hardcoat layer-attached cyclic polyolefin-based resin film, and an acrylic hardcoat layer-attached (meth)acrylic resin film, respectively, and the resin compositions were applied to the hardcoat layers side.

In addition, No. 5 was a silicon substrate that was used after being wiped with BEMCOT (manufactured by Asahi Kasei Corporation) impregnated with acetone (manufactured by FUJIFILM Wako Pure Chemical Corporation) and then dried with an air gun.

The measurement results of the surface tension σs and the surface tension σr, the surface tension differences Δσ (|σs−σr|), and the evaluation results of the defect portion of the resin layer on the substrate layer are all shown in Table 2 ("Defect evaluation" in Table 2). Numerical values in the parentheses in "Defect evaluation" in Table 2 are the values of the area ratios (%).

TABLE 2

| | | Resin layer | | Substrate layer | | Surface | |
|---|---|---|---|---|---|---|---|
| | | Resin composition No. | Surface tension σr (mN/m) | No. | Surface tension σs (mN/m) | tension difference Δσ (mN/m) | Defect evaluation |
| Example | 1 | 6 | 38.4 | 1 | 46.9 | 8.5 | A (93.7) |
| | 2 | 6 | 38.4 | 2 | 44.6 | 6.2 | A (100) |
| | 3 | 6 | 38.4 | 3 | 39.5 | 1.1 | A (94.6) |
| | 4 | 7 | 36.2 | 1 | 46.9 | 10.7 | A (95.3) |
| | 5 | 8 | 36.9 | 1 | 46.9 | 10 | A (98.1) |
| | 6 | 9 | 36.5 | 1 | 46.9 | 10.4 | A (91.2) |
| | 7 | 6 | 38.4 | 5 | 47.6 | 9.2 | A (98.9) |

TABLE 2-continued

| | | Resin layer | | Substrate layer | | Surface | |
|---|---|---|---|---|---|---|---|
| | | Resin composition No. | Surface tension $\sigma r$ (mN/m) | No. | Surface tension $\sigma s$ (mN/m) | tension difference $\Delta\sigma$ (mN/m) | Defect evaluation |
| Comparative Example | 1 | 6 | 38.4 | 4 | 26.6 | 11.8 | C (34.3) |
| Reference Example | 1 | 10 | 38.1 | 4 | 26.6 | 11.4 | A (100) |

REFERENCE SIGNS LIST

1 Layered body, 10 substrate layer, 20 resin layer

The invention claimed is:

1. A layered body comprising: a substrate layer; and a resin layer disposed on at least one surface of the substrate layer, wherein the resin layer contains a light scattering agent (A) and quantum dots (B), a content of the light scattering agent (A) in the resin layer is 1% by mass or more and 30% by mass or less based on a total amount of the resin layer;

a content of the quantum dots (B) in the resin layer is 10% by mass or more and 50% by mass or less based on the total amount of the resin layer; and when a surface tension of the substrate layer is indicated by $\sigma s$ (mN/m) and a surface tension of the resin layer is indicated by $\sigma r$ (mN/m), the following formula:

$$6.2 \leq |\sigma s - \sigma r| \leq 11.0$$

is satisfied.

2. The layered body according to claim 1, wherein the surface tension $\sigma s$ is 30 mN/m or more.

3. The layered body according to claim 1, wherein the resin layer is a cured material layer of a resin composition containing a resin (C), a photopolymerizable compound (D), and a photopolymerization initiator (E).

4. The layered body according to claim 1, wherein the light scattering agent (A) contains $TiO_2$ particles.

5. A display device comprising the layered body according to claim 1.

6. The layered body according to claim 1, wherein the surface tension $\sigma r$ is 30 mN/m or more.

* * * * *